United States Patent
Jo

(10) Patent No.: US 10,211,397 B1
(45) Date of Patent: Feb. 19, 2019

(54) THRESHOLD VOLTAGE TUNING FOR A VOLATILE SELECTION DEVICE

(71) Applicant: Crossbar, Inc., Santa Clara, CA (US)

(72) Inventor: Sung Hyun Jo, Sunnyvale, CA (US)

(73) Assignee: CROSSBAR, INC., Santa Clara, CA (US)

( * ) Notice: Subject to any disclaimer, the term of this patent is extended or adjusted under 35 U.S.C. 154(b) by 0 days.

(21) Appl. No.: 14/793,392

(22) Filed: Jul. 7, 2015

Related U.S. Application Data

(60) Provisional application No. 62/021,660, filed on Jul. 7, 2014.

(51) Int. Cl.
  *H01L 47/00* (2006.01)
  *H01L 45/00* (2006.01)
  *H01L 27/24* (2006.01)

(52) U.S. Cl.
  CPC ........ *H01L 45/085* (2013.01); *H01L 27/2463* (2013.01); *H01L 45/1266* (2013.01); *H01L 45/16* (2013.01)

(58) Field of Classification Search
  CPC ........................... H01L 45/085; H01L 45/1273
  See application file for complete search history.

(56) References Cited

U.S. PATENT DOCUMENTS

| | | |
|---|---|---|
| 6,849,891 B1 | 2/2005 | Hsu et al. |
| 6,855,975 B2 * | 2/2005 | Gilton ................ G11C 13/0011 257/104 |
| 7,176,530 B1 | 2/2007 | Bulucea et al. |
| 7,187,577 B1 | 3/2007 | Wang et al. |
| 7,274,064 B2 | 9/2007 | Bertin et al. |
| 7,280,390 B2 | 10/2007 | Kostylev et al. |
| 7,368,752 B2 | 5/2008 | Luyken et al. |
| 7,388,775 B2 | 6/2008 | Bedeschi et al. |

(Continued)

FOREIGN PATENT DOCUMENTS

| | | |
|---|---|---|
| CN | 1506972 A | 6/2004 |
| CN | 1542848 A | 11/2004 |

(Continued)

OTHER PUBLICATIONS

Office Action dated Mar. 17, 2015 for U.S. Appl. No. 14/573,770, 19 Pages.

(Continued)

*Primary Examiner* — Samuel Gebremariam
*Assistant Examiner* — Jonas T Beardsley
(74) *Attorney, Agent, or Firm* — Amin, Turocy & Watson, LLP

(57) ABSTRACT

A first architecture for a volatile resistive-switching device with a selector layer (e.g., a highly resistive layer such as a resistive switching medium) non-planar surfaces is detailed. For example, the selector layer can have a first surface that intersects a second surface at an angle (e.g., oblique angle). The angle can be adjusted to control current-voltage response for the volatile resistive-switching device. A second architecture for volatile resistive-switching device with a first terminal having a high particle diffusivity and a second terminal having a low particle diffusivity. The second architecture can provide diode-like current-voltage responses at a sizes (e.g., sub-20 nanometers) in which conventional diodes do not scale.

20 Claims, 13 Drawing Sheets

(56) References Cited

U.S. PATENT DOCUMENTS

| | | | |
|---|---|---|---|
| 7,577,024 B2 | 8/2009 | Fackenthal et al. | |
| 7,579,612 B2 | 8/2009 | Tang et al. | |
| 7,704,788 B2 | 4/2010 | Youn et al. | |
| 7,786,464 B2 | 8/2010 | Nirschl et al. | |
| 7,791,060 B2 | 9/2010 | Aochi et al. | |
| 7,829,875 B2 | 11/2010 | Scheuerlein | |
| 7,830,698 B2 | 11/2010 | Chen et al. | |
| 7,835,174 B2 | 11/2010 | Tokiwa | |
| 7,859,884 B2 | 12/2010 | Scheuerlein | |
| 7,881,097 B2 | 2/2011 | Hosomi et al. | |
| 7,897,953 B2 | 3/2011 | Liu | |
| 7,920,412 B2 | 4/2011 | Hosotani et al. | |
| 7,924,138 B2 | 4/2011 | Kinoshita et al. | |
| 7,961,506 B2 | 6/2011 | Liu | |
| 8,004,882 B2 | 8/2011 | Katti et al. | |
| 8,018,760 B2 | 9/2011 | Muraoka et al. | |
| 8,045,364 B2 | 10/2011 | Schloss et al. | |
| 8,067,815 B2 | 11/2011 | Chien et al. | |
| 8,102,698 B2 | 1/2012 | Scheuerlein | |
| 8,139,392 B2 | 3/2012 | Hosoi | |
| 8,164,948 B2 | 4/2012 | Kattie et al. | |
| 8,218,350 B2 | 7/2012 | Kozicki | |
| 8,278,170 B2 | 10/2012 | Lee et al. | |
| 8,320,160 B2 | 11/2012 | Nazarian | |
| 8,329,537 B2 | 12/2012 | Kim et al. | |
| 8,351,241 B2 | 1/2013 | Lu et al. | |
| 8,369,139 B2 | 2/2013 | Liu et al. | |
| 8,411,485 B2 | 4/2013 | Nazarian et al. | |
| 8,502,185 B2 | 8/2013 | Lu et al. | |
| 8,587,050 B2 | 11/2013 | Ohba | |
| 8,659,933 B2 | 2/2014 | Jo | |
| 8,735,247 B2 | 5/2014 | Yoo et al. | |
| 8,767,441 B2 | 7/2014 | Lu et al. | |
| 8,993,397 B2 | 3/2015 | Herner | |
| 9,023,719 B2 | 5/2015 | Pachamuthu et al. | |
| 9,305,624 B2 | 4/2016 | Shepard | |
| 2001/0007447 A1 | 7/2001 | Tanaka et al. | |
| 2004/0114413 A1 | 6/2004 | Parkinson et al. | |
| 2004/0170040 A1 | 9/2004 | Rinerson et al. | |
| 2006/0097238 A1* | 5/2006 | Breuil | G11C 13/0011 |
| | | | 257/4 |
| 2006/0231910 A1 | 10/2006 | Hsieh et al. | |
| 2006/0286762 A1 | 12/2006 | Tseng et al. | |
| 2007/0047297 A1 | 3/2007 | Campbell et al. | |
| 2007/0268744 A1 | 11/2007 | Taguchi | |
| 2008/0192531 A1 | 8/2008 | Tamura et al. | |
| 2008/0291719 A1 | 11/2008 | Fackenthal et al. | |
| 2008/0301497 A1 | 12/2008 | Chung et al. | |
| 2009/0014707 A1 | 1/2009 | Lu et al. | |
| 2009/0027976 A1 | 1/2009 | Brewer et al. | |
| 2009/0122592 A1 | 5/2009 | Tokiwa | |
| 2009/0231910 A1* | 9/2009 | Liu | H01L 27/2427 |
| | | | 365/163 |
| 2009/0315092 A1 | 12/2009 | Mikasa | |
| 2010/0008127 A1 | 1/2010 | Muraoka et al. | |
| 2010/0124093 A1 | 5/2010 | Shiga et al. | |
| 2010/0157656 A1 | 6/2010 | Tsuchida | |
| 2010/0176367 A1 | 7/2010 | Liu | |
| 2010/0220523 A1 | 9/2010 | Modha et al. | |
| 2010/0237314 A1 | 9/2010 | Tsukamoto et al. | |
| 2010/0243983 A1 | 9/2010 | Chiang et al. | |
| 2010/0252909 A1 | 10/2010 | Nakanishi et al. | |
| 2011/0033967 A1 | 2/2011 | Lutz et al. | |
| 2011/0089391 A1 | 4/2011 | Mihnea et al. | |
| 2011/0140068 A1 | 6/2011 | Ozawa et al. | |
| 2011/0149639 A1 | 6/2011 | Carter et al. | |
| 2011/0175087 A1 | 7/2011 | Yamazaki et al. | |
| 2011/0305065 A1 | 12/2011 | Nazarian et al. | |
| 2011/0310656 A1 | 12/2011 | Kreupl et al. | |
| 2011/0317470 A1 | 12/2011 | Lu et al. | |
| 2012/0007035 A1* | 1/2012 | Jo | H01L 45/085 |
| | | | 257/4 |
| 2012/0025160 A1 | 2/2012 | Sonehara | |
| 2012/0033483 A1 | 2/2012 | Koyama | |
| 2012/0044751 A1 | 2/2012 | Wang et al. | |
| 2012/0063203 A1 | 3/2012 | Matsuzaki et al. | |
| 2012/0112156 A1 | 5/2012 | Park et al. | |
| 2012/0122290 A1 | 5/2012 | Nagashima | |
| 2012/0132971 A1 | 5/2012 | Mikasa | |
| 2012/0176831 A1 | 7/2012 | Xiao et al. | |
| 2012/0187410 A1 | 7/2012 | Yamazaki et al. | |
| 2012/0211719 A1 | 8/2012 | Haimoto et al. | |
| 2012/0211722 A1 | 8/2012 | Kellam et al. | |
| 2012/0236650 A1 | 9/2012 | Nazarian | |
| 2012/0250395 A1 | 10/2012 | Nodin | |
| 2012/0305879 A1 | 12/2012 | Lu et al. | |
| 2012/0314472 A1 | 12/2012 | Chung | |
| 2013/0001501 A1* | 1/2013 | Sills | H01L 45/04 |
| | | | 257/4 |
| 2013/0264534 A1 | 10/2013 | Hwang et al. | |
| 2013/0313508 A1 | 11/2013 | Kawasaki | |
| 2013/0334593 A1 | 12/2013 | Seol et al. | |
| 2014/0048860 A1 | 2/2014 | Mikasa et al. | |
| 2014/0063903 A1 | 3/2014 | Chang et al. | |
| 2014/0092669 A1 | 4/2014 | Chen et al. | |
| 2014/0098594 A1 | 4/2014 | Azuma et al. | |
| 2014/0112058 A1 | 4/2014 | Kellam et al. | |
| 2014/0231740 A1 | 8/2014 | Ohba | |
| 2014/0284544 A1 | 9/2014 | Miyagawa et al. | |
| 2014/0292365 A1 | 10/2014 | Said | |
| 2015/0070966 A1 | 3/2015 | Bandyopadhyay et al. | |
| 2015/0074326 A1 | 3/2015 | Castro | |
| 2015/0076579 A1 | 3/2015 | Tsuji et al. | |
| 2015/0179662 A1 | 6/2015 | Makala et al. | |
| 2015/0179705 A1 | 6/2015 | Wouters et al. | |
| 2015/0187792 A1 | 7/2015 | Shingu et al. | |
| 2015/0294716 A1 | 10/2015 | Tortorelli et al. | |
| 2016/0012886 A1 | 1/2016 | Nazarian et al. | |
| 2016/0104715 A1 | 4/2016 | Pachamuthu et al. | |
| 2016/0111639 A1 | 4/2016 | Wells et al. | |
| 2016/0141337 A1 | 5/2016 | Shimabukuro et al. | |
| 2016/0190208 A1 | 6/2016 | Nazarian et al. | |
| 2016/0204117 A1 | 7/2016 | Liu et al. | |
| 2016/0211386 A1 | 7/2016 | Tomai et al. | |
| 2016/0268341 A1 | 9/2016 | Nazarian | |
| 2017/0104031 A1 | 4/2017 | Clark et al. | |
| 2017/0169887 A1 | 6/2017 | Widjaja | |
| 2017/0352410 A1 | 12/2017 | Castro | |

FOREIGN PATENT DOCUMENTS

| | | |
|---|---|---|
| CN | 1714406 A | 12/2005 |
| CN | 1961378 A | 5/2007 |
| CN | 101252019 A | 8/2008 |
| CN | 101501850 A | 8/2009 |
| CN | 102468321 A | 5/2012 |
| CN | 102598266 A | 7/2012 |
| CN | 102986048 A | 3/2013 |
| CN | 103682091 A | 3/2014 |
| JP | 2000058681 A | 2/2000 |
| JP | 2001249324 A | 9/2001 |
| JP | 2006-318627 A | 11/2006 |
| JP | 2008277543 A | 11/2008 |
| JP | 2009-538491 A | 11/2009 |
| JP | 2009267185 A | 11/2009 |
| JP | 2010009669 A | 1/2010 |
| JP | 2010087007 A | 4/2010 |
| JP | 2010519762 A | 6/2010 |
| JP | 2010186872 A | 8/2010 |
| JP | 201123645 A | 2/2011 |
| JP | 2011129639 A | 6/2011 |
| JP | 2014036034 A | 2/2014 |
| KR | 10-1357847 B1 | 2/2014 |
| TW | 201214673 A | 4/2012 |
| WO | 2011005266 A1 | 1/2011 |
| WO | 2012/178114 A2 | 12/2012 |
| WO | 2013052321 A2 | 4/2013 |

OTHER PUBLICATIONS

International Search Report and Written Opinion for PCT Application No. PCT/US2015/17370 dated Jul. 13, 2015, 17 Pages.

(56) References Cited

OTHER PUBLICATIONS

Wouters, "Scaling challenges for 2-terminal select devices," ITRS ERD Selector Workshop, Apr. 2012, 41 pages, IMEC, Noorderwijk, NL.
Office Action for U.S. Appl. No. 14/588,185 dated May 27, 2015, 23 pages.
Taiwanese Office Action dated Aug. 11, 2016 for Taiwanese Application No. 104121989, 10 pages (including translation).
Chinese Office Action dated Nov. 23, 2015 for Chinese Patent Application No. 201280027066.9, 12 pages (including translation).
Office Action dated Oct. 3, 2013 for U.S. Appl. No. 13/921,157, 10 pages.
International Search Report and Written Opinion for PCT Application No. PCT/US20121040232 dated Feb. 26, 013, 9 pages.
Office Action dated May 7, 2013 for U.S. Appl. No. 13/585,759, 12 pages.
Office Action dated May 23, 2013 for U.S. Appl. No. 13/592,224, 9 pages.
Notice of Allowance dated Sep. 19, 2013 for U.S. Appl. No. 13/585,759, 9 pages.
Office Action dated Dec. 6, 2013 for U.S. Appl. No. 13/960,735, 10 pages.
International Search Report and Written Opinion for PCT Application No. PCT/US2013/054976 dated Dec. 16, 2013, 9 pages.
Notice of Allowance dated Jul. 22, 2015 for U.S. Appl. No. 14/612,025, 11 pages.
Notice of Allowance dated Oct. 20, 2016 for U.S. Appl. No. 15/066,504, 28 pages.
Office Action dated Jul. 13, 2016 for U.S. Appl. No. 14/755,998, 22 pages.
Office Action dated Aug. 3, 2015 for U.S. Appl. No. 14/717,185, 26 Pages.
Office Action dated Jul. 6, 2016 for U.S. Appl. No. 14/726,071, 25 Pages.
Ex Parte Quayle Office Action dated Aug. 18, 2016 for U.S. Appl. No. 14/795,105, 13 Pages.
Office Action dated May 31, 2016 for U.S. Appl. No. 14/678,112, 15 pages.
Japanese Office Action dated Aug. 2, 2016 for Japanese Application No. 2015-102280, 13 pages (including translation).
Taiwanese Office Action dated Aug. 19, 2016 for Taiwanese Application No. 104107381, 7 pages (including translation).
Japanese Office Action dated Aug. 9, 2016 for Japanese Application No. 2015-137033, 6 pages (including translation).
Chinese Office Action dated Dec. 27, 2016 for Chinese Patent Application No. 201510105630.X, 16 pages (including English translation).
Japanese Office Action dated Mar. 7, 2017 for Japanese Application Serial No. JP2015-102280, 6 pages (including English translation).
Korean Office Action dated Feb. 27, 2017 for Korean Application No. 10-2015-0096673, 7 pages (including English translation).
Korean Office Action dated Mar. 6, 2017 for Korean Application No. 10-2015-0097600, 5 pages (including English translation).
Office Action dated Mar. 30, 2017 for U.S. Appl. No. 14/726,071, 64 pages.
Chinese Office Action dated Apr. 5, 2017 for Chinese Patent Application No. 201510260810.5, 16 pages (including English translation).
Office Action dated Aug. 21, 2017 for U.S. Appl. No. 14/726,071, 93 pages.
Notice of Allowance dated Jul. 31, 2017 for U.S. Appl. No. 15/195,458, 58 pages.
Office Action dated Aug. 29, 2017 for U.S. Appl. No. 15/256,007, 59 pages.
Office Action dated Oct. 6, 2017 for U.S. Appl. No. 15/469,179, 29 pages.
Search Report dated Dec. 27, 2016 for Chinese Patent Application No. 201510105630.X, 1 page.
Office Action dated Oct. 30, 2017 for U.S. Appl. No. 15/495,574, 48 pages.
Korean Office Action dated Oct. 30, 2017 for Korean Application No. 10-2015-0096673, 7 pages. (including English ranslation).
European Office Action and Search Report dated Oct. 18, 2017 for European Application No. 15762196.2, 7 pages.
Office Action dated Jun. 19, 2012 for U.S. Appl. No. 13/149,757, 11 pages.
Office Action dated Dec. 6, 2013 for U.S. Appl. No. 13/960,735, 19 pages.
Office Action dated Apr. 8, 2016 for U.S. Appl. No. 14/573,770, 8 pages.
Taiwanese Office Action dated Oct. 19, 2016 for Taiwanese Application No. 104122122, 7 pages (including translation).
Office Action dated Dec. 15, 2016 for U.S. Appl. No. 14/726,071, 62 pages.
Wolf, "Silicon Processing for the VLSI Era vol. 3: The Submicron Mosfet", Lattice Press, 1995, pp. 200-201.
Office Action dated Dec. 22, 2016 for U.S. Appl. No. 14/641,466, 45 pages.
Office Action dated Dec. 29, 2016 for U.S. Appl. No. 15/195,417, 38 pages.
Final Office Action dated May 25, 2018 for U.S. Appl. No. 15/256,007.
Notice of Allowance dated May 16, 2018 for U.S. Appl. No. 15/469,179, 37 pages.
Notice of Allowance dated Jul. 2, 2018 for U.S. Appl. No. 15/797,447, 38 pages.
Search Report dated Jul. 8, 2016 for Japanese Application No. JP2015-137033, 16 pages.
Chinese Office Action dated Dec. 11, 2017 for Chinese Patent Application No. 201510260810.5, 6 pages. (including English translation).
Office Action dated Jan. 17, 2018 for U.S. Appl. No. 14/726,071, 99 pages.
Communication pursuant to Rules 70(2) and 70a(2) EPC dated Nov. 7, 2017 issued in European Application No. 15762196.2, 1 page.
Taiwanese Office Action and Search Report for Taiwanese Patent Application No. 104116008 dated Jul. 17, 2018, 20 pages (including English translation).
Chinese Office Action and Search Report received for Chinese Patent Application No. 201510395749.5 dated Sep. 4, 2018, 11 pages (including English translation).
Decision to Grant a Patent received for Japanese Patent Application No. 2015-136046 dated Jul. 12, 2016, 6 pages (including English translation).
Decision to Grant a Patent received for Japanese Patent Application No. 2015-137033 dated Feb. 28, 2017, 5 pages (including English translation).
Chinese Office Action and Search Report received for Chinese Patent Application No. 201510401832.9 dated Oct. 8, 2018, 9 pages (including English translation).

\* cited by examiner

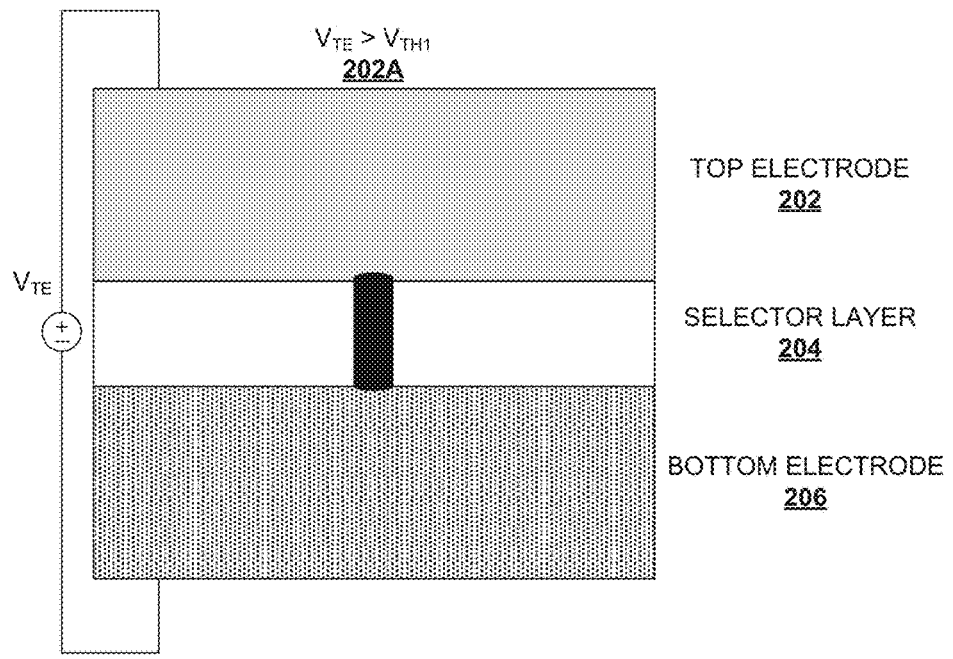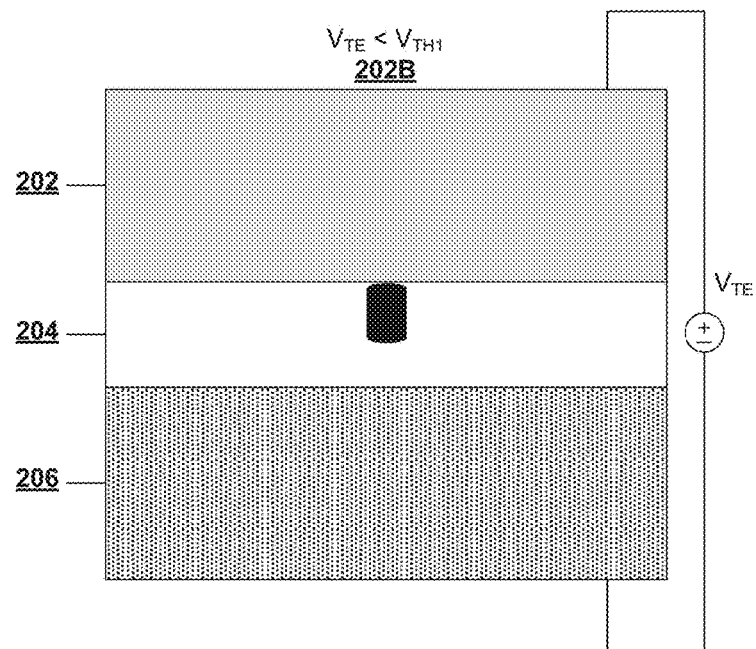
FIG. 2

SELECTOR LAYER FILAMENT BEHAVIOR FROM BOTTOM ELECTRODE
300
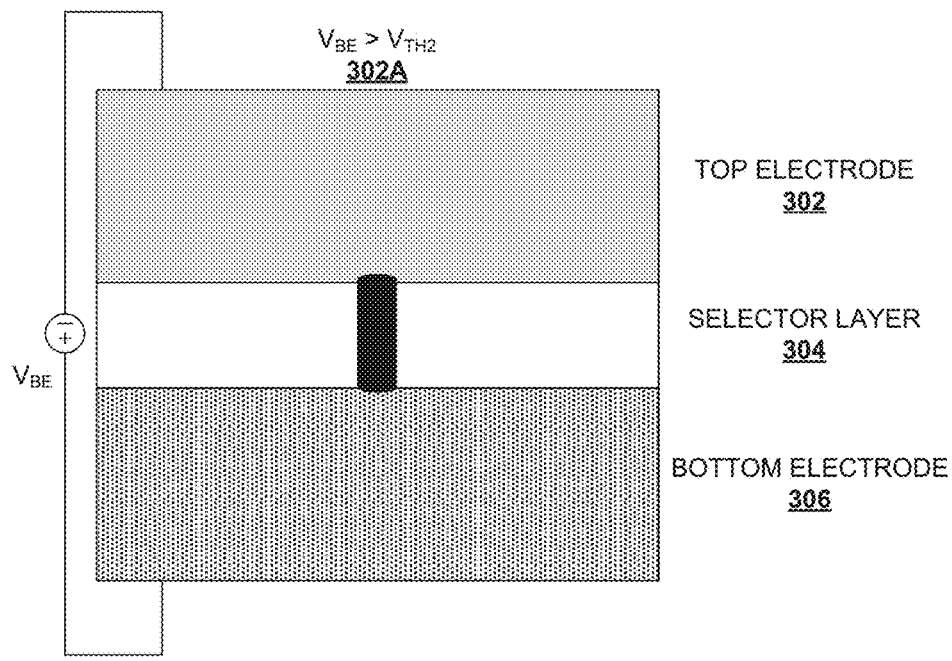
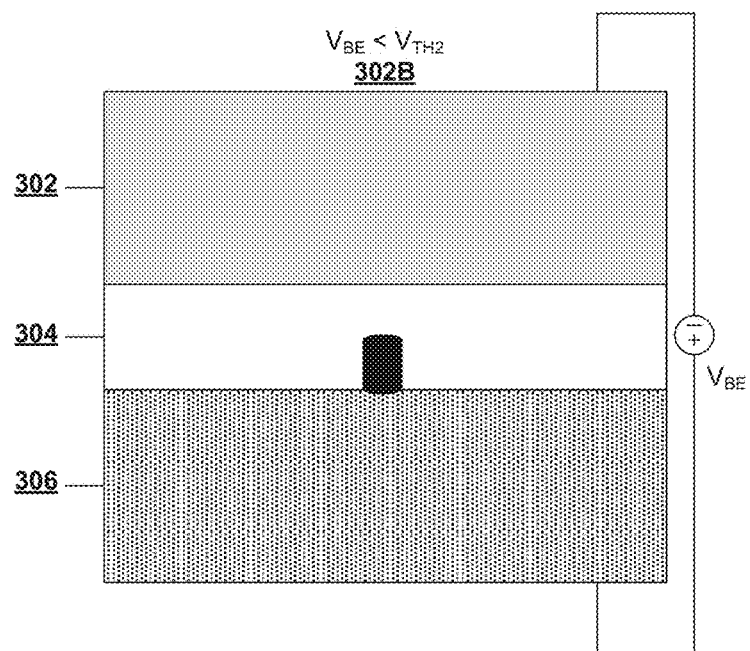
FIG. 3

1000

```
        ┌───┐
        │ B │
        └─┬─┘
          ▼
┌─────────────────────────────────────────┐
│ SELECTING THE FIRST OBLIQUE ANGLE TO    │
│ INCREASE OR DECREASE AN ELECTRICAL FIELD│──1002
│ MAGNITUDE PRODUCED NEAR THE FIRST       │
│ INTERSECTION IN RESPONSE TO AN EXTERNAL │
│ ELECTRICAL STIMULUS                     │
└─────────────────────────────────────────┘
          │
          ▼
┌─────────────────────────────────────────┐
│ SELECTING THE SECOND OBLIQUE ANGLE TO   │
│ INCREASE OR DECREASE AN ELECTRICAL FIELD│──1004
│ MAGNITUDE PRODUCED NEAR THE SECOND      │
│ INTERSECTION IN RESPONSE TO AN EXTERNAL │
│ ELECTRICAL STIMULUS                     │
└─────────────────────────────────────────┘
          │
          ▼
┌─────────────────────────────────────────┐
│ SELECTING THE FIRST CONDUCTIVE MATERIAL │
│ TO FORM A FIRST CONDUCTIVE FILAMENT     │──1006
│ WITHIN THE SELECTOR LAYER IN RESPONSE TO│
│ A NEGATIVE POLARITY VOLTAGE             │
└─────────────────────────────────────────┘
          │
          ▼
┌─────────────────────────────────────────┐
│ SELECTING THE SECOND CONDUCTIVE         │
│ MATERIAL TO FORM A SECOND CONDUCTIVE    │──1008
│ FILAMENT WITHIN THE SELECTOR LAYER IN   │
│ RESPONSE TO A POSITIVE POLARITY VOLTAGE │
└─────────────────────────────────────────┘
          │
          ▼
       ( STOP )
```

FIG. 10

THRESHOLD VOLTAGE TUNING FOR A VOLATILE SELECTION DEVICE

CROSS REFERENCE TO RELATED APPLICATIONS

This application for patent claims the benefit of U.S. provisional patent application Ser. No. 62/021,660, entitled FIELD ASSISTED SUPERLINEAR THRESHOLD (FAST™) and filed Jul. 7, 2014, and is related to U.S. patent application Ser. No. 14/588,185, entitled SELECTOR DEVICE FOR TWO-TERMINAL MEMORY and filed Dec. 31, 2014, each of which are incorporated by reference herein in their respective entireties and for all purposes.

TECHNICAL FIELD

This disclosure relates generally to electronic memory, for example, the disclosure describes a volatile resistive switching device configured to provide a non-linear current-voltage response.

BACKGROUND

A recent innovation within the field of integrated circuit technology is resistive-switching devices. While much of resistive-switching technology is in the development stage, various technological concepts for resistive memory have been demonstrated by the assignee of the present invention and are in one or more stages of verification to prove or disprove associated theory(ies). Even so, resistive-switching technology promises to hold substantial advantages over competing technologies in the semiconductor electronics industry.

One example of a resistive-switching device is resistive random access memory (RRAM). The inventors of the present disclosure believe RRAM has the potential to be a high density non-volatile information storage technology. Generally, RRAM stores information by controllably switching among distinct resistive states. A single resistive memory can store a single bit of information, or multiple bits, and can be configured as a one-time programmable cell, or a programmable and erasable device, as various memory models demonstrated by the assignee provide.

Various theories have been proposed by the inventors to explain the phenomenon of resistive switching. In one such theory, resistive switching is a result of formation of a conductive structure within an otherwise electrically insulating medium. The conductive structure could be formed from ions, atoms that can be ionized under appropriate circumstances (e.g., a suitable electric field), or other charge carrying mechanisms. In other such theories, field-assisted diffusion of atoms can occur in response to a suitable electric potential applied to a resistive memory cell. In still other theories proposed by the inventors, formation of the conductive filament can occur in response to joule heating and electrochemical processes in binary oxides (e.g., NiO, $TiO_2$, or the like), or by a redox process for ionic conductors including oxides, chalcogenides, polymers, and so on.

The inventors expect resistive devices based on an electrode-insulator-electrode model to exhibit good endurance and life cycle. Further, the inventors expect such devices to have high on-chip densities. Accordingly, resistive elements may be viable alternatives to metal-oxide semiconductor (MOS) transistors employed for digital information storage. The inventors of the subject patent application, for instance, believe that models of resistive-switching memory devices provide some potential technical advantages over non-volatile Flash MOS devices.

In light of the above, the inventors endeavor to make further improvements in memory technology, and resistive memory.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

In various embodiments of the present disclosure, there is provided a selector device for solid state memory applications. The selector device can be configured to have a non-linear current-voltage (I-V) relationship, in various embodiments. Furthermore, the selector device can, in isolation, be a volatile device that has a first electrical state in response to a first electrical condition, and a second electrical state in absence of the first electrical condition.

Disclosed in accordance with one or more embodiments is a first method for fabricating a volatile resistive-switching device. The first method can comprise forming a first terminal comprising a first conductive material within or overlying a semiconductor substrate material. Moreover, the first method can comprise forming a selector layer overlying and in electrical contact with the first terminal, wherein the selector layer comprises a first surface and a second surface that intersects, at a first intersection, the first surface at a first oblique angle. The selector layer can comprises an electrical insulator material with few particle-trapping defect sites, the few particle-trapping defect sites configured to receive particles of the metal material. The first method can also comprise forming a second terminal, overlaying and in electrical contact with the selector layer, comprising a second conductive material.

Disclosed in accordance with some embodiments is a second method for fabricating a volatile resistive-switching device. The second method can comprise forming a first terminal comprising a first metal. The first metal can be configured to have a low particle diffusivity. Moreover, the second method can comprise forming a selector layer. The selector layer can, in some embodiments be overlying and in electrical contact with the first terminal. Further, the selector layer can comprises an electrical insulator material with few particle-trapping defect sites, the few particle-trapping defect sites configured to receive particles of a metal or other conductive material. The second method can also comprise forming a second terminal comprising a second metal. In some embodiments, the second terminal can be overlaying and in electrical contact with the selector layer.

The second metal can be configured to have a high particle diffusivity that, in response to a first voltage applied across the first terminal and the second terminal, provides a first number of conductive ions to the selector layer. The first metal can be configured to have a low particle diffusivity that, in response to a second voltage applied across the first terminal and the second terminal, provides a second number of conductive ions to the selector layer, the second number of conductive ions being smaller than the first number of conductive ions In accordance with still other embodiments of the disclosed subject matter, disclosed is volatile resistive-switching device. The device comprises a first electrode comprising a first metal. The device further comprises a selector layer over the first electrode having a non-planar surface in contact with a corresponding non-planar surface of the first electrode, wherein an angle of the non-planar surface increases or decreases an electric field magnitude affecting the selector layer in response to an external stimulus. The device still further comprises a second electrode, in contact with the selector layer, comprising a second metal.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIG. 2 illustrates a block diagram of a sample selector device behavior in response to an electrical characteristic of a first polarity according to various disclosed embodiments;

FIG. 3 depicts a block diagram of a sample selector device behavior in response to an electrical characteristic of a second polarity according to various disclosed embodiments;

FIG. 10 illustrates a flowchart of an example method for fabricating the volatile resistive-switching device in accordance with additional elements or aspects according to various disclosed embodiments;

DETAILED DESCRIPTION

Figure 1:
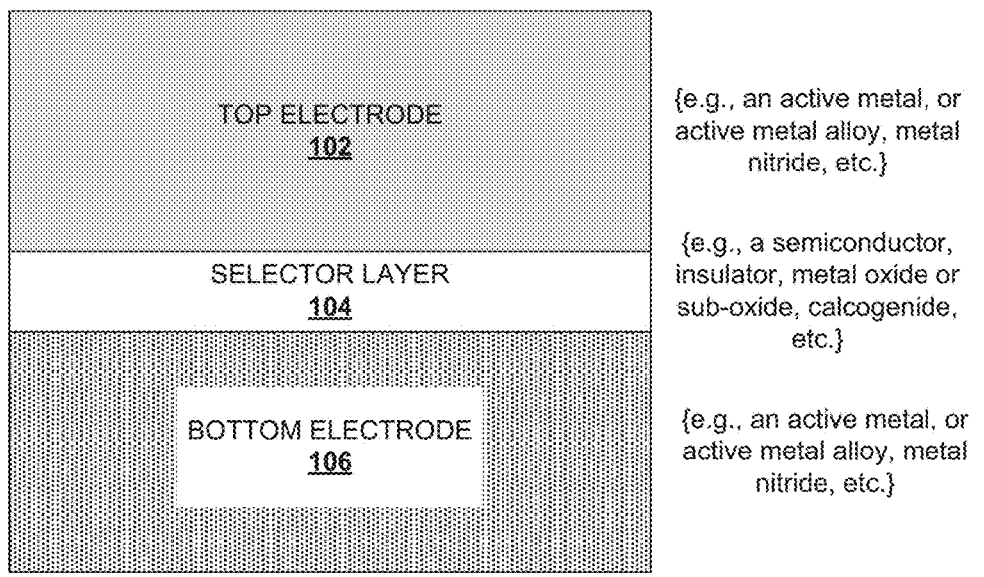
FIG. 1 depicts a block diagram of an example monolithic structure providing a solid state selector device according to various disclosed embodiments.

For the purposes of this disclosure, the field of resistive technologies can be divided into two sub-groups: volatile and non-volatile.

Non-Volatile:

Non-volatile resistive technology can relate to, e.g., a resistive-switching two-terminal memory cell. Resistive-switching two-terminal memory cells (also referred to as resistive-switching memory cells or resistive-switching memory), as utilized herein, comprise circuit components having conductive contacts (e.g., electrodes or terminals) with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. Examples of a resistive switching two-terminal memory device, though not exhaustive, can include a resistive random access memory (RRAM), a phase change RAM (PCRAM) and a magnetic RAM (MRAM).

The state of a non-volatile two-terminal memory devices is typically determined by electrical characteristics associated with the memory (e.g., conductance, resistance, etc.). These electrical characteristics can be affected by the degree to which a conductive filament is present/absent within the electrically resistive active region. For example, in response to external stimuli (e.g., a suitable voltage applied across the memory device), an electric field is created at or near one or more of the conductive contacts. This electric field can ionize particles of the conductive contacts and drive those ionized particles into the active region, creating a conductive filament. The active region typically contains a large number of defect sites that trap particles of the conductive filament such that when the external stimuli are removed, the conductive filament remains in the active region. Hence, the device is in a low-resistive and/or high-conductance state and this state is substantially non-volatile. Conversely, to return the memory device to a high-resistive and/or low-conductance state, different external stimuli are applied (e.g., a voltage with different magnitude or polarity, or both), which causes the particles trapped in the active region to be driven back to the conductive contact source.

Volatile:

Volatile resistive technology can operate according to similar principles as non-volatile resistive technology with certain notable distinctions. For example, in absence of the external stimuli, filament-forming particles driven into the active region retreat back to conductive contact source. Hence, the change in the state of the device caused by the external stimuli does not remain after the external stimuli are removed. This distinction exists due in part to a difference in design of the active region or other portions of the device. For instance, while non-volatile resistive-switching two-terminal memory cells tend to have active regions with a high number of defect sites (to trap ionized particles), corresponding active regions of volatile resistive-switching devices have few or fewer defect sites to trap the filament-forming particles. As used herein, the terms "high", "low", "many", and "few" or similar, when used in connection with a number of defect sites are intended to expressly define, distinguish, or relate to a threshold between volatile and non-volatile resistive-switching devices. For example, a non-volatile device can be said to have a high number of defect sites in the active region because that number of defects sites is sufficient to maintain the conductive filament when the external stimuli that created the conductive filament are removed. Conversely, a volatile device can be said to have few defect sites in the active region because the existing number of defect sites is not sufficient to maintain the conductive filament when the external stimuli that created the conductive filament are removed.

While volatile resistive-switching devices typically do not provide for long-term memory storage as do non-volatile memory, volatile resistive-switching devices can provide numerous benefits. As an example, volatile resistive-switching devices can be wired in series with non-volatile memory to, e.g., minimize leak current. Some details pertaining to such embodiments can be found in the following U.S. patent application that is licensed to the assignee of the present application for patent: application Ser. No. 14/588,185, filed Dec. 31, 2014, which is incorporated by reference herein in its entirety and for all purposes. As another example, volatile resistive-switching devices can operate to store memory (e.g., in a volatile manner) or perform logic operations, and can function in both bipolar and unipolar designs. As further detailed herein, volatile resistive-switching devices can be provided that advantageously do not have symmetrical electrical response characteristics and thus can, e.g., be operated in a manner that substantially reduces power and/or increases sensing margin. Further, volatile resistive-switching devices can be provided that form conductive filaments in response to a particular polarity, but substantially resist filament forming in response to the opposite polarity. Hence, some embodiments disclosed herein can, advantageously, operate in a manner similar to diodes, but at scales smaller than conventional diodes can achieve In more detail, embodiments of the subject disclosure can provide a volatile resistive-switching device. In various embodiments, the volatile resistive-switching device can be filamentary-based devices. One example of a filamentary-based device can comprise: a conductive layer, e.g., metal, doped p-type (or n-type) silicon (Si) bearing layer (e.g., p-type or n-type polysilicon, p-type or n-type polycrystalline SiGe, etc.), a resistive switching layer (RSL) and an active metal layer capable of being ionized. Under suitable conditions, the active metal layer can provide filament-forming ions to the RSL. In such embodiments, a conductive filament (e.g., formed by the ions) can facilitate electrical conductivity through at least a subset of the RSL, and a resistance of the filament-based device can be determined by a tunneling resistance between the filament and the conductive layer.

In various embodiments of a memory cell of the present disclosure, a p-type or n-type Si bearing layer can include a p-type or n-type polysilicon, p-type or n-type polycrystalline SiGe, or the like. A RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), a porous dielectric (e.g., a porous metal or silicon oxide), a low-K dielectric, and so forth. Other examples of materials suitable for the RSL could include $Si_XGe_YO_Z$ (where X, Y and Z are respective suitable positive numbers), a silicon oxide (e.g., $SiO_N$, where N is a suitable positive number), amorphous Si (a-Si), amorphous SiGe (a-SiGe), $TaO_B$ (where B is a suitable positive number), $HfO_C$ (where C is a suitable positive number), $TiO_D$ (where D is a suitable number), $Al_2O_E$ (where E is a suitable positive number) and so forth, or a suitable combination thereof. In various embodiments, the RSL includes a number of material voids or defects.

An active metal layer for a filamentary-based memory cell can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), hafnium (Hf), and palladium (Pd). Other suitable conductive materials, as well as compounds, alloys, or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

In various disclosed embodiments, filamentary-based switching devices are disclosed and their operation is described. In some embodiments, a filamentary-based switching device can be a volatile switching device, which exhibits a first measurably distinct state in the absence of a suitable external stimulus, and exhibits a second measurably distinct state in response to the suitable external stimulus. The volatile filamentary-based switching device is can be referred to herein as a selector device, or selection device, filamentary selector device, filamentary-based selector device, and so on; though such devices, their composition or application should not be limited by this terminology. In other embodiments, a filamentary-based switching device can be a non-volatile switching device, which exhibits a first measurably distinct state until a suitable first external stimulus is applied to change the non-volatile switching device to a second measurably distinct state. The non-volatile switching device then exhibits the second measurably distinct state until a suitable second external stimulus is applied. Non-volatile filamentary-based switching devices can have more than two measurably distinct states, leading to multi-level cell functionality, though this disclosure refers generally to the binary case. Non-volatile filamentary-based switching devices are generally referred herein as a memory cell, resistive memory cell, filamentary-based memory cell, or the like, but again the composition, function or application of such devices should not be limited by this terminology.

A filamentary selector device (e.g., a volatile resistive-switching device) can exhibit a first state (e.g., a first electrical resistance, or other suitable measurable characteristic) in the absence of a suitable external stimulus. The stimulus can have a threshold value or range of such values that induces the filamentary selector device to change from the first state to a second state while the stimulus is applied. In response to the stimulus falling below the threshold value (or threshold range of values) the filamentary selector device returns to the first state. In some disclosed embodiments, a filamentary based selector device can operate in a bipolar fashion, behaving differently in response to different polarity (or direction, energy flow, energy source orientation, etc.) external stimuli. As an illustrative example, in response to a first polarity stimulus exceeding a first threshold voltage (or set of voltages), the filamentary selector device can change to the second state from the first state. Moreover, in response to a second polarity stimulus exceeding a second threshold voltage(s), the filamentary selector device can change to a third state from the first state. In some embodiments, the third state can be substantially the same as the first state, having the same or similar measurably distinct characteristic (e.g., electrical conductivity, and so forth), having the same or similar magnitude of threshold stimulus (though of opposite polarity or direction), or the like. In other embodiments, the third state can be distinct from the second state, either in terms of the measurable characteristic (e.g., different electrically conductivity value in response to the reverse polarity as compared to the forward polarity) or in terms of threshold stimulus associated with transitioning out of the first state (e.g., a different magnitude of positive voltage required to transition to the second state, compared to a magnitude of negative voltage required to transition to the third state).

In some embodiments, and by way of example, a disclosed filamentary based selector device can form a conductive path or filament through a relatively high resistive portion in response to a suitable external stimulus. The voltage (or other external stimulus) at which the conductive filament forms is referred to herein as a "threshold voltage" or an "activation voltage". The external stimulus can cause metallic particles within an active metal layer to migrate within (or ionize within) a RSL layer of the filamentary selector device. Further, the RSL can be selected to have relatively few physical defect locations for the volatile filamentary switching device, facilitating relatively good mobility of the metallic particles within the RSL. Accordingly, below an associated threshold stimulus (or narrow range of threshold values), the metallic particles can be dispersed within the RSL to prevent formation of a sufficient conductive path through the RSL to lower a high resistance associated with the first state. Above the threshold, the external stimulus maintains the metallic particles in sufficient formation to provide the conductive path, leading to relatively low resistance of the second state. An analogous mechanism can control operation of the third state in the bipolar context.

In embodiments detailed herein, the volatile resistive-switching device (e.g., AKA selector device) can be tuned or adjusted based on various characteristics of the selector device. For example, in some embodiments, a magnitude associated with threshold voltages can be changed as a function of a thickness associated with the RSL (e.g., a selector layer). In some embodiments, the magnitude associated with threshold voltages can be changed in a manner such that a positive polarity threshold voltage is asymmetrical with respect to a negative polarity threshold voltage. In effect, an I-V graph is offset or shifted one direction or the other along the voltage axis. Such an effect can be accomplished by changing the shape of the RSL. For instance, rather than existing as a simple layer shaped as a single plane, the RSL can include a bend or corner/vertex. The bend can be configured at a particular angle (e.g., oblique, right angle, etc.), and the angle can be selected to provide the desired I-V response or other characteristic. Thus, the RSL can include surfaces span multiple planes and/or are non-planar.

In embodiments detailed herein, the volatile resistive-switching device (e.g., AKA selector device) can be configured with a one electrode comprising a metal of high particle diffusivity and the other electrode comprising a metal of low particle diffusivity. Such, e.g., can change the I-V graph in a manner similar to that of a diode, but at scales below the ability of conventional diodes to operate.

For a non-volatile filamentary-based resistive switching memory cell, an RSL can be selected to have sufficient physical defect sites therein so as to trap particles in place in the absence of a suitable external stimulus, mitigating particle mobility and dispersion. This, in response to a suitable program voltage applied across the memory cell, a conductive path or a filament forms through the RSL. In particular, upon application of a programming bias voltage, metallic ions are generated from the active metal layer and migrate into the RSL layer. More specifically, metallic ions migrate to the voids or defect sites within the RSL layer. In some embodiments, upon removal of the bias voltage, the metallic ions become neutral metal particles and remain trapped in voids or defects of the RSL layer. When sufficient particles become trapped, a filament is formed and the memory cell switches from a relatively high resistive state, to a relatively low resistive state. More specifically, the trapped metal particles provide the conductive path or filament through the RSL layer, and the resistance is typically determined by a tunneling resistance through the RSL layer. In some resistive-switching devices, an erase process can be implemented to deform the conductive filament, at least in part, causing the memory cell to return to the high resistive state from the low resistive state. More specifically, upon application of an erase bias voltage, the metallic particles trapped in voids or defects of the RSL become mobile and migrate back towards the active metal layer. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known to one of ordinary skill by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

The inventors of the subject application are familiar with additional non-volatile, two-terminal memory structures in addition to resistive memory. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. Though resistive-switching memory technology is referred to with many of the embodiments disclosed herein, other two-terminal memory technologies can be utilized for some of the disclosed embodiments, where suitable to one of ordinary skill in the art.

High density integration of memory often utilizes an array structure, in which multiple cells are connected along conductive lines of an integrated chip, such as bitlines, wordlines, datalines, sourcelines, and the like. However, the inventors of the present disclosure believe that, while connecting multiple cells to a common conductive line can enhance memory density, such an arrangement can also result in electrical problems such as leakage current, reduced sensing margin, excess power consumption, and the like. This can be particularly evident for memory cells programmed to a low resistance state. As an illustrative example, an operational voltage applied to a selected conductive line, that is commonly connected to a target memory cell and several non-targeted memory cells, can result in significant current flow at non-targeted memory cells in a low resistance state. Where a large number of non-targeted memory cells are connected to the selected conductive line (e.g., to achieve high memory density), significant power is consumed by this current. Additionally, capacitive voltages on nearby conductive lines caused by the operational voltage can result in leakage current from the nearby conductive lines to the selected conductive line. In addition to consuming additional power, this leakage current reduces sensing margin for a memory operation performed on the target memory cell.

To reduce excess power consumption and leakage current in a memory array, a transistor may be connected to each memory cell, sometimes referred to as a 1 transistor-1 memory cell architecture. The transistor can be deactivated to shut off current through the memory cell, minimizing leakage current at that memory cell. However, addition of a transistor for each memory cell can significantly increase size of the memory cell (and reduce density of an associated array of memory). Some memory arrays balance memory density with leakage current, by implementing a 1 transistor-n memory cell architecture, where n is an integer greater than 1. In this architecture, increasing the number, n, of memory cells per transistor implements a trade-off between memory density and leakage current and power consumption. Thus, the inventors understand that traditional attempts to achieve increased memory density can result in increased power consumption and associated joule heating, reduced sensing margin, and other problems.

Various embodiments of the present disclosure provide a selector device (e.g., a volatile switching device) configured to provide non-linear current-voltage (I-V) response for a memory cell (e.g., a non-volatile switching device) associated with the selector device. In particular, the non-linear I-V response can significantly reduce leakage current at the associated memory cell. Further, the selector device can be a monolithic solid state construct fabricated in conjunction with the associated memory cell that does not substantially increase the size of the memory cell. In the context of resistive memory cell technology, the disclosed selector device can facilitate a 1 transistor-n resistor (1T-nR) architecture with high memory density. In some embodiments, the number of memory cells, n, per transistor can be 512, 1024, or even larger, without significantly impacting leakage current of a memory array. Accordingly, the disclosed selector device can facilitate high memory densities with low leakage current, low power consumption and good sensing margin.

Referring now to the drawings, FIG. 1 illustrates a block diagram of an example volatile resistive-switching device 100 according to one or more embodiments of the present disclosure. Volatile resistive-switching device 100 can be a two-terminal device configured to be operable in response to a suitable electric signal applied at one or more of two terminals of volatile resistive-switching device 100. In various disclosed embodiments, volatile resistive-switching device 100 can have a non-linear I-V response, in which volatile resistive-switching device 100 exhibits current within a first range in response to a first range of voltage magnitudes, and current within a second range (e.g., much higher in magnitude than the first range) in response to a second range of voltage magnitudes. The first range of voltage magnitudes and second range of voltage magnitudes can be distinguished, as one example, by a threshold voltage, or a threshold range of voltages (e.g., having magnitude(s) between the first range of voltage magnitudes and the second range of voltage magnitudes). In further embodiments, volatile resistive-switching device 100 can be fabricated in series with a two-terminal memory device (not depicted) as part of a monolithic fabrication process (e.g., photolithographic process, mask and etching process, and so forth). In these latter embodiments, volatile resistive-switching device 100 can be configured to provide a non-linear I-V response for the two-terminal memory device, reducing leakage current and lowering power consumption, while facilitating increased memory density for an array of such memory cells in series with respective ones of volatile resistive-switching device 100. For instance, in the case of a two-terminal resistive memory cell, volatile resistive-switching device 100 can facilitate a high density 1T-nR memory array with relatively high values for n, while mitigating leakage current and reducing power consumption for the 1T-nR memory array. In various embodiments, volatile resistive-switching device 100 may be embodied as a FAST™ selector device, currently under development by the current assignee of the present patent application.

Volatile resistive-switching device 100 is depicted by FIG. 1 to have a top electrode 102 and a bottom electrode 106. Top electrode 102 and bottom electrode 106 are electrical conductors, and are comprised of materials suitable to facilitate conduction of current. In one or more embodiments, top electrode 102 and bottom electrode 106 can comprise a material(s) providing or facilitates provision of mobile atoms or ions in response to a suitable stimulus. Examples of suitable stimuli can include an electric field (e.g. a programming voltage), joule heating, a magnetic field, or other suitable stimuli for directed or partially directed particle motion. In at least one embodiment, particle mobility can be in response to undirected or partially undirected dispersion, or similar phenomena.

Examples of suitable materials for top electrode 102 or bottom electrode 106 can include a noble metal (e.g., Ag, Pd, Pt, Au, etc.) or a metal alloy containing noble metal in part (e.g., Ag—Al, Ag—Pd—Cu, Ag—W, Ag—Ti, Ag—TiN, Ag—TaN, and so forth). A noble metal or alloy thereof can be utilized to facilitate mitigated interaction between top electrode 102 or bottom electrode 106 and a selector layer 104, for instance. This mitigated particle interaction (e.g., mitigating or avoiding chemical bonding of top electrode 102 or bottom electrode 106 particles with particles of selector layer 104) can facilitate improved longevity and reliability for volatile resistive-switching device 100, as one example. Another example of a suitable material for top electrode 102 or bottom electrode 106 can include a material with relatively fast diffusing particles. Faster diffusion can include, for instance, a capacity to move among defect sites (e.g., voids or gaps in molecular material) within a solid, facilitating dispersion of the relatively fast diffusion particles absent an aggregating force, for instance. Materials with relatively fast diffusing particles can facilitate fast state switching of selector device 100 (e.g., from a non-conductive state to a conductive state), at lower bias values. Examples of suitable fast diffusing materials can include Ag, Cu, Au, Co, Ni, Al, Fe, or the like, suitable alloys thereof, or suitable combinations of the foregoing.

In at least one embodiment, top electrode 102 can be comprised of the same material or substantially the same material as bottom electrode 106. In other embodiments, top electrode 102 and bottom electrode 106 can be different materials (see e.g., FIG. 7A). In still other embodiments, top electrode 102 and bottom electrode 106 can be at least in part the same material, and in part different materials. For instance, top electrode 102 could comprise a suitable conductive material, and bottom electrode 106 could at least in part comprise an alloy of the suitable conductive material, or the suitable conductive material in combination with another suitable conductor, as an illustrative example.

In addition to the foregoing, volatile resistive-switching device 100 includes selector layer 104 (e.g., an RSL). In contrast to top electrode 102 or bottom electrode 106, selector layer 104 can be an electrical insulator or ionic conductor. Further, selector layer 104 can be a material (e.g., an oxide) at least weakly permeable to particles of top electrode 102 or bottom electrode 106. In some embodiments, selector layer 104 can be a non-stoichiometric material. Examples of suitable materials for selector layer 104 can include a-Si, SiGe, Ge, $SiO_x$, $TiO_x$, $AlO_x$, $WO_x$, $Ti_xN_yO_z$, HfOx, TaOx, CuOx, NbOx, or the like, or suitable combinations thereof, where x, y and z can be suitable non-stoichiometric values. In some embodiments, selector layer 104 can be a chalcogenide or a solid-electrolyte material containing one or more of Ge, Sb, S, Te. In yet another embodiment, the selector material can comprise a stack of a plurality of the above mentioned materials (e.g. SiOx/GeTe, TiOx/AlOx). In at least one embodiment of the present disclosure, selector layer 104 can be doped with a metal(s) during fabrication, to facilitate metal ion injection from the top or bottom electrode.

In operation, a suitable electric signal can be applied to top electrode 102 or bottom electrode 106 to induce a state change of selector device 100. State change can be a change in resistance or conductivity, for instance. As one illustrative example, a voltage, field, current, etc., can be applied at top electrode 102 or bottom electrode 106 having at least a threshold magnitude associated with inducing the state change of volatile resistive-switching device 100. In response to such a signal at the threshold magnitude, volatile resistive-switching device 100 can transition from a non-conducting state having a high electrical resistance and a first current (or a first range of currents), to a relatively-conducting state having a lower electrical resistance and a second current (or a second range of currents). In various embodiments, a current ratio of the first current to the second current can be at least about 1,000 or more. For instance, in one embodiment, the current ratio can be selected from a range of current ratios from about 1,000 to about 10,000. In another embodiment, the current ratio can be selected from a range of current ratios from about 10,000 to about 100,000. In yet another embodiment, the current ratio can be selected from a range of current ratios from about 100,000 to about 1,000,000. In still other embodiments, the current ratio can be selected from a range of current ratios from about 1,000,000 to about 10,000,000 or more. Other suitable current ratios can be provided for a selector device 100 in various other suitable embodiments.

FIG. 2 illustrates a block diagram depicting operational behavior of a selector device 200 in response to applied signals, according to additional embodiments of the present disclosure. For instance, selector device 200 comprises a top electrode 202, selector layer 204 and bottom electrode 206, as depicted. In at least some embodiments, selector device 200 can be substantially similar to volatile resistive-switching device 100 of FIG. 1, supra, although the subject disclosure is not so limited.

At the top of FIG. 2, selector device 200 is illustrated with a first signal 202A applied to selector device 200. First signal 202A is greater than a threshold magnitude associated with non-linear I-V response of selector device 200. In various embodiments, the threshold magnitude may be embodied as a narrow range of threshold magnitudes (e.g., see below). It should be appreciated that reference herein to a threshold magnitude (e.g., voltage magnitude) associated with a non-linear I-V response of a selector device could include a narrow range of threshold magnitudes (e.g., a range of voltage values) over which an I-V response transitions from linear (or approximately linear) behavior, to non-linear behavior. The range of magnitudes can vary as suitable for different sets of materials, arrangement of such materials, characteristics of such materials (e.g., thickness, area, conductivity, etc.), or the like, selected for components of the selector device.

Although first signal 202A is depicted as a voltage, e.g., where top electrode voltage $V_{TE}$ is greater than a first threshold voltage $V_{TH1}$ of selector device 200, in other embodiments first signal 202A can comprise other signals inducing particle mobility of particles of top electrode 202 or bottom electrode 206, such as an electric field, a current, or even a temperature associated with joule heating. In addition to the foregoing, first signal 202A can be of a first polarity (e.g., at least in the electrical sense). For instance, first signal 202A can have a positive gradient applied from top electrode 202 to bottom electrode 206 (e.g., a positive voltage or field at top electrode 202 and ground or negative voltage or field at 206, current flow from top electrode 202 to bottom electrode 206, and so forth).

In response to first signal 202A (top electrode 202 relative to bottom electrode 206), particles of top electrode 202 (or bottom electrode 206) can form a conductive path(s), or filament(s), within selector layer 204 as depicted, which are depicted here as dark cylinders. In some embodiments, the particles can migrate into selector layer 204 from top electrode 202 (or bottom electrode 206) in response to first signal 202A. In other embodiments—for instance where selector layer 204 is doped with metallic particles—particles within selector layer 204 can be ionized or aligned (e.g., spatially organized along the conductive path(s)) in response to first signal 202A. In still other embodiments, particles can migrate from top electrode 202 (or bottom electrode 206) in combination with existing particles within selector layer 204 being ionized and aligned in response to first signal 202A, to form the conductive path(s) if the selector layer is doped with metal particles. Formation of the conductive path(s) can facilitate transition from a non-conductive state to a conductive state, associated with non-linear I-V response of selector device 200. Moreover, suitable formation of the conductive path(s) can be in response to a magnitude of first signal 202A meeting or exceeding a first threshold magnitude. Thus, the first threshold magnitude is associated with causing the transition to the conductive state.

At the bottom of FIG. 2, selector device 200 observes a second signal 202B applied to top electrode 202 (relative to bottom electrode 206). Second signal 202B can have a magnitude less than the first threshold magnitude (e.g., $V_{TE}<V_{TH1}$ e.g. $V_{TE}\approx0V$), and in response selector device 200 can transition from the (highly) conductive state to the (relatively) non-conductive state. In that case, the conductive path (e.g., dark cylinder) does not span the full thickness of selector layer 204, or may be absent entirely. Again, in various embodiments, the first threshold magnitude may span a narrow range of magnitudes. A conductive path(s) formed in response to first signal 202A can dissipate, at least in part, in response to second signal 202B, as depicted within selector layer 204 in the bottom of FIG. 2, or in response to removal of the first signal 202A. Dissipation can occur as a result of particle tendency to migrate within or out of selector layer 204, when an external force (e.g., second signal 202B) is of insufficient strength to hold the particles in the conductive path(s) through selector layer 204, from top electrode 202 through bottom electrode 206. Thus, in one embodiment below the lowest threshold magnitude from a narrow range of magnitudes, the conductive path(s) is at least in part deformed, whereas at or above the highest threshold magnitude from the narrow range of magnitudes, the conductive path(s) can be formed sufficiently enough to cause the conductive state for selector device 200. To reiterate the above, in various embodiments herein, it should be understood that reference to a threshold voltage may actually refer to a set of threshold voltages (e.g., within a narrow range of voltages) associated with formation and deformation of a conductive path.

As described above, selector device 200 can transition from the non-conductive state to the conductive state, and back to the non-conductive state, in a volatile manner. In other words, selector device 200 can be in the conductive state in response to the first signal 202A having the first threshold magnitude being applied to selector device 200. Selector device 200 can be in the non-conductive state in response to the second signal 202B having less than the first threshold magnitude being applied to the selector device 200.

In some embodiments, selector device 200 can be combined in electrical series with a two-terminal memory cell (e.g., a resistive switching memory, etc.). Selector device 200 can provide a non-linear I-V characteristic for a two-terminal memory cell when provided in series there with. Moreover, the non-linear I-V characteristic can be provided whether the two-terminal memory cell is in a conductive state or non-conductive state. For instance, a signal below the first threshold magnitude will cause selector device 200 to be in the non-conductive state. In the non-conductive state, selector device 200 will resist current through the series combination of selector device 200 and the two-terminal memory cell when the signal is below the first threshold. When the signal is equal to or above the threshold magnitude, selector device 200 will be conductive, and a state of the two-terminal memory cell can determine electrical characteristics of the series combination of: selector device 200 and the two-terminal memory cell. Thus, activating selector device 200 will facilitate operational access to the two-terminal memory cell. Deactivating selector device 200 will resist operational access to the two-terminal memory cell (e.g., by resisting current through the series combination, and by dropping a majority of the voltage applied across the series combination, etc.). Because selector device 200 is volatile, and in the non-conducting state in the absence of a signal having the first threshold magnitude, the two-terminal memory cell is inaccessible and retains information (e.g., retains a current state thereof). Selector device 200, on the other hand, provides a non-linear I-V response for the series combination, resisting leakage current and facilitating a memory array having high density.

FIG. 3 illustrates a block diagram depicting operational behavior of an example selector device 300 according to further aspects of the subject disclosure. Selector device 300 can be substantially similar to selector device 100 or selector device 200, in one or more embodiments. However, the subject disclosure is not so limited.

Operational behavior of selector device 300 is illustrated in response to signals of a second polarity, different from the first polarity of first signal 202A and second signal 202B, described with respect to FIG. 2, supra. For instance, the second polarity can be opposite or approximately opposite the first polarity, in various embodiments. As an illustrative example, the second polarity can comprise a signal gradient (e.g., voltage gradient, current gradient, joule heating gradient, etc.) that is greater value measured from bottom electrode 306 and lesser value measured from top electrode 302.

At the top of FIG. 3, a first signal 302A having magnitude equal to or greater than a second threshold magnitude (or second range of threshold magnitudes, as suitable) is applied at bottom electrode 306 relative to top electrode 302. Particles of bottom electrode 306 migrate within and through a selector layer 304 in response to first signal 302A. The second threshold magnitude is associated with suitable formation of a conductive path(s) across selector layer 304, from bottom electrode 306 to top electrode 302, to induce a conductive state for selector device 300, illustrated once again by a dark cylinder. Note that in some embodiments, the second threshold magnitude (or range of magnitudes) can be different (different values) from the first threshold magnitude (or range of magnitudes) associated with formation of conductive path(s) from top electrode 202 relative to bottom electrode 206 as depicted by FIG. 2, supra. Difference in magnitude can occur, for instance, where the top electrode and bottom electrode are formed of different materials having different particle mobility, different ion strength, different size, different shape, or the like. Said differently, employing different materials, sequences of materials (e.g., adding an addition layer—such as a barrier layer—between selector layer 304 and top electrode 302, or bottom electrode 306), material properties or characteristics for top electrode 302 or bottom electrode 306 can lead to different threshold voltages associated with filament formation from top electrode 202 to bottom electrode 206 (as depicted in FIG. 2) as compared with filament formation from bottom electrode 306 to top electrode 302 (as depicted in FIG. 3).

As depicted by FIG. 3, formation of the conductive path(s) can comprise suitable particles of bottom electrode 306 migrating through selector layer 304, from bottom electrode 306 to top electrode 302, or pre-existing metal particles in selector layer 304 aligning/migrating to form the conductive path(s) (e.g., where the selector layer is doped with metal particles). At the bottom of FIG. 3, a second signal 302B having magnitude less than the second threshold magnitude (or range of magnitudes) is applied at bottom electrode 306. In response to the second signal, particles of the conductive path(s) disperse through selector layer 304 (or toward/into bottom electrode 306), at least in part deforming the conductive path(s). This induces a non-conductive state for selector device 300. Thus, in one embodiment below the lowest threshold magnitude from a narrow range of magnitudes, the conductive path(s) is at least in part deformed, whereas at or above the highest threshold magnitude from the narrow range of magnitudes, the conductive path(s) can be formed sufficiently enough to cause the conductive state for selector device 300. To reiterate the above, in various embodiments herein, it should be understood that reference to a threshold voltage may actually refer to a set of threshold voltages (from a narrow range of voltages) depending on whether a conductive path is formed or deformed.

In other embodiments, if polarity of the voltage source is defined as positive to negative relative to top electrode 302 and bottom electrode 306, below the lowest threshold magnitude from a narrow range of magnitudes, the conductive path(s) can be formed sufficiently enough to cause the conductive state for selector device 300, whereas at or above the highest threshold magnitude from the narrow range of magnitudes, the conductive path(s) is at least in part deformed. Examples of this will be illustrated, below.

In various embodiments, selector device 300 can have the properties described above with respect to selector device 200 in response to a signal of the first polarity. Thus, selector device 300 can form a conductive path(s) comprising particles from top electrode 302 extending through selector layer 304 in response to a signal of the first polarity, and can form a second conductive path(s) comprising particles from bottom electrode 306 extending through selector layer 304 in response to a signal of the second polarity. In at least some embodiments, the conductive path can at least in part comprise particles of bottom electrode 306 (e.g., near to a boundary of bottom electrode 306), and likewise the second conductive path can at least in part comprise particles of top electrode 302 (e.g., near to a boundary of top electrode 302). Thus, selector device 300 can have a first threshold magnitude to facilitate transition to a first conducting state along the first polarity, and a second threshold magnitude to facilitate transition to a second conductive state along the second polarity. This operation can be implemented in conjunction with a bipolar memory cell, providing non-linear I-V characteristics for first polarity signals as well as for second polarity signals. In pragmatic terms, bidirectional non-linear I-V characteristics can facilitate resistance to leakage currents from either positive or negative polarity signals. Thus, the series combination of selector device 300 and a two-terminal memory cell can mitigate leakage current resulting from a programming signal or read signal (e.g., having a first polarity) or an erase signal (e.g., having the second polarity). In at least some embodiments, it should be appreciated that this description of selector device 300 (and other suitable descriptions for FIG. 3), can have analogous applicability to selector device 200 of FIG. 2, supra. Also, the reverse is true; illustrative embodiments described with respect to selector device 200 can be applicable to selector device 300 in suitable embodiments. Accordingly, the example embodiments described for FIGS. 3 and 2 should be considered interchangeable, where suitable.

In various embodiments, selector device 300 can be operated within a set of operational parameters. In some embodiments, the set of operational parameters can be selected to maintain volatile state-switching of selector layer 304 (e.g., by forming a relatively weak filament, which at least in part deforms below a threshold signal magnitude), provide switching longevity, achieve a target power consumption, or the like, or a suitable combination thereof. In some embodiments, current through selector device 300 (and, e.g., the series combination of selector device 300 and a two-terminal memory cell) can be limited to a maximum current value.

For instance, the maximum current value can be limited to 300 microamps (pA) or below, 300 μA or below, or another suitable maximum value. In other embodiments, selector layer 304 can have a thickness maintained within a target range of thicknesses. For example, the thickness of selector layer 304 can be from about 0.5 nanometers (nm) to about 50 nm. In various embodiments, based upon current experimental data, typical thicknesses which provide surprisingly effective results based upon a threshold voltage of about 1 volt may be within a range of about 1 to about 20 nm, and more specifically about 1 nm to about 10 nm. In at least one embodiment, the thickness of selector layer 304 (or, e.g., selector layer 204 of FIG. 2, infra) can be selected to provide a signal threshold magnitude (e.g., voltage threshold, current threshold, field strength threshold, etc.) associated with state-switching of selector device 300 to have a target value, or be within a target range. As one illustrative example, the thickness can be selected to provide a threshold voltage associated with state-switching to be between about 0.1 volts and about 4 volts. Maintaining the threshold voltage at a target value can mitigate or avoid formation of a non-volatile filament.

In some embodiments, a stoichiometric value(s) of material utilized for selector layer 304 (or selector layer 204) can be provided at a target value. For instance, a stoichiometric value for 'x' for a SiOx selector layer 304 (or selector layer 204) can be between about 0.5 and about 2. In at least one embodiment, the stoichiometric value can be selected to achieve a target width for a conductive path (e.g., filament) through selector layer 304 (or selector layer 204). In some embodiments, increasing stoichiometric value(s) of the material utilized for selector layer 304 (or selector layer 204) can reduce defect density of selector layer 304 or 204 (e.g., density of dangling bonds, density of particle voids, and so forth), and the stoichiometric value can be selected to achieve a target defect density to provide the target width for the conductive path. In at least one disclosed embodiment, selector layer thickness and stoichiometric value can be respectively selected to achieve a target trade-off between maximum threshold voltage and maximum defect density.

Figure 4:
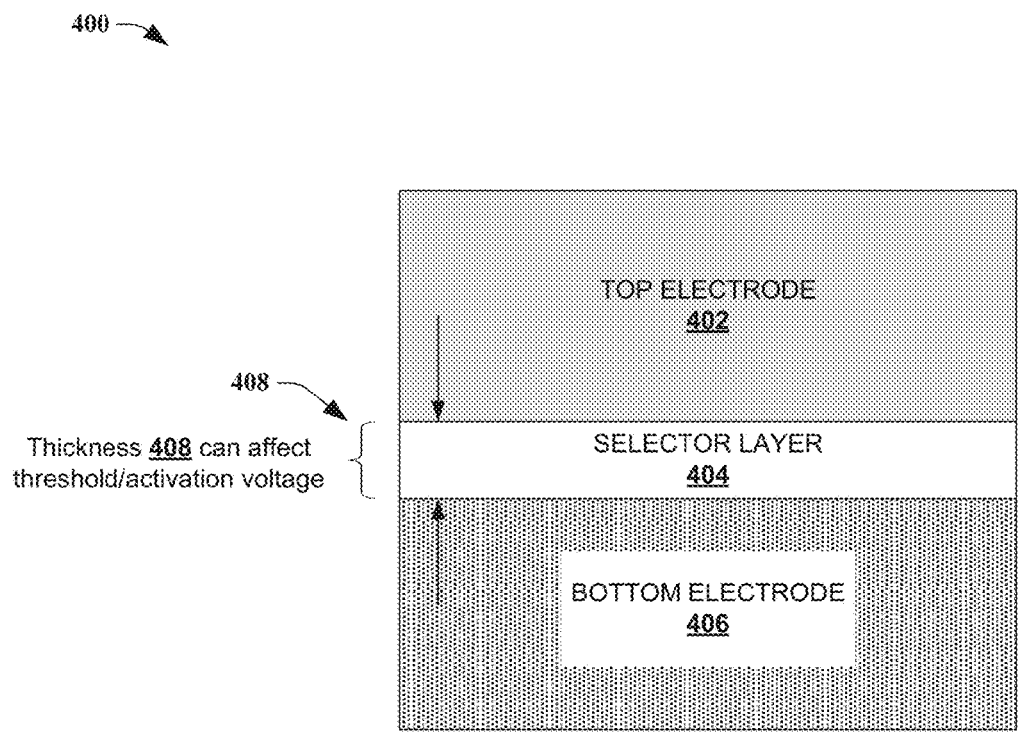
FIG. 4 depicts a block diagram of a volatile resistive-switching device illustrating that I-V characteristics associated with a volatile resistive-switching device can have with threshold voltages that operate as a function of a thickness of a selector layer of the volatile resistive-switching device according to various disclosed embodiments.

FIG. 4 provides a volatile resistive-switching device 400 that illustrates that I-V characteristics associated with a volatile resistive-switching device (e.g., 100, 200, 300, 400, etc.) can have with threshold voltages that operate as a function of a thickness of a selector layer of the volatile resistive-switching device. In this example, the volatile resistive-switching device 400 includes a top electrode 402, a selector layer 404 and a bottom electrode 406, as substantially detailed herein.

As depicted, the selector layer 404 has a thickness 408. Certain threshold voltages (e.g., a voltage that causes a conductive filament to form, resulting in a low-resistance state) decrease in magnitude as thickness 408 decrease. For example, if thickness 408 is about 18 nanometers (nm), threshold voltage magnitude may be about ±1.3 volts (e.g., positive 1.3 volts or negative 1.3 volts) or some other value. If thickness 408 is about 10 nanometers (nm), threshold voltage magnitude may be about ±0.8 volts or otherwise less than the value for 18 nm. If thickness 408 is about 5 nanometers (nm), threshold voltage magnitude may be about ±0.3 volts, or less than the value for 10 nm. It is appreciated that these threshold voltage magnitudes are, in this example in which selector layer 404 is flat in shape, symmetrical about the zero volt line. In other words, the magnitude of a given positive polarity threshold voltage is approximately equal to the magnitude of the corresponding negative polarity threshold voltage, which is distinct from examples provided in connection with FIGS. 5A-7B, infra.

Figure 5A:
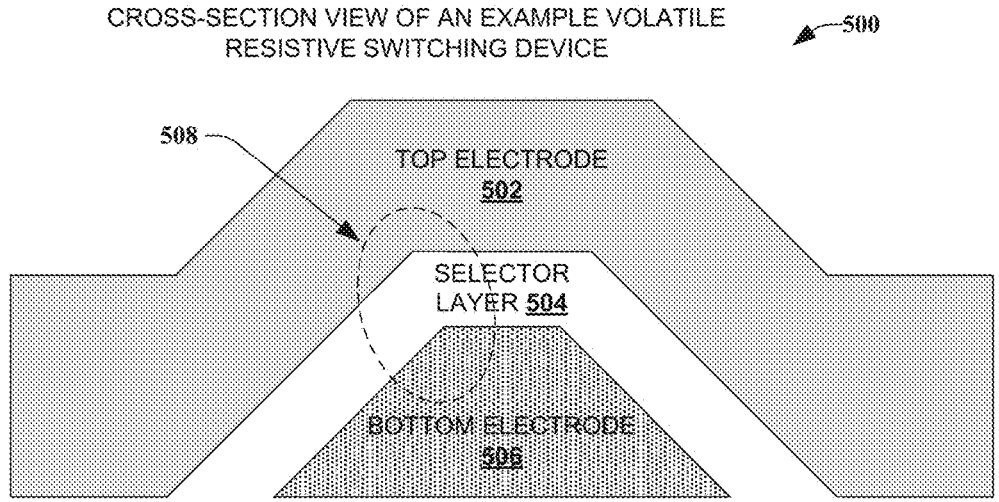
FIG. 5A depicts a cross-section view of an example volatile resistive-switching device with a selector layer having one or more bends or angles according to various disclosed embodiments.

Turning now to FIG. 5A, illustration 500 is provided. Illustration 500 depicts a cross-section view of an example volatile resistive-switching device with a selector layer having one or more bends or angles. While previous devices have been illustrated having flat selector layers, it is appreciated that such can also arranged as depicted herein and thus be operable to achieve the benefits or advantages now described. As before, the volatile resistive-switching device depicted by illustration 500 comprises a top electrode 502, a selector layer 504, and a bottom electrode 506, all of which have been described in connection with other Figures. Illustration 500 further depicts selector layer having one or more bends or angles, one of which is highlighted by the dashed oval of area 508. Area 508 illustrates that selector layer 504, rather than being entirely or substantially flat in shape, the shape can be non-planar and/or follow multiple planes, which is further illustrated in connection with FIG. 5B. As depicted, other bends or angles can exist as well, which can provide similar or dissimilar properties as those detailed in connection with area 508.

Figure 5B:
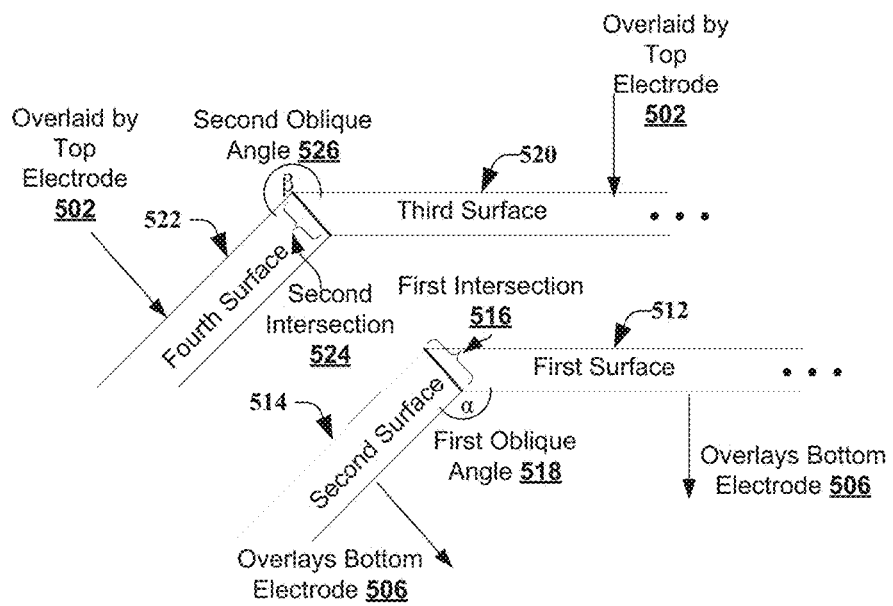
FIG. 5B depicts a three-dimensional wire view of a portion of the selector layer with a bend or angle according to various disclosed embodiments.

Referring now to FIG. 5B, illustration 510 is depicted. Illustration 510 provides a three-dimensional wire view of a portion of the selector layer 504. Illustration 510 is intended to further illustrate various example aspects or elements relating to area 508. For example, selector layer 504 can include a first surface 512 and a second surface 514. In this example, such surfaces are the "bottom" of selector layer 504 and therefore can be overlying and in electrical contact with bottom terminal 506. First surface 512 can intersect second surface 514 at first intersection 516, which can form a first oblique angle 518, denoted here as, a.

In some embodiments, first oblique angle 518 can be less than about 180 degrees, as is depicted by illustration 510. In some embodiments, oblique angles detailed herein such as first oblique angle 518, are intended to be what is well known as an oblique angle (e.g., any angle not divisible by 90 degrees), however in other embodiments, such oblique angles can include right angles (e.g., 90 degrees or 270 degrees) as well. In some embodiments, first oblique angle 518 can be greater than about 180 degrees, which is not depicted here, but see, e.g., FIG. 6B.

At the "top" of selector layer 504, e.g., the portion of selector layer 504 that is overlaid and in electrical contact with top electrode 502, a third surface 520 and a fourth surface 522 are depicted. Third surface 520 can intersect fourth surface 522 at second intersection 524, which can form a second oblique angle 518, denoted here as, β. In some embodiment, first oblique angle 518 and second oblique angle 526 can be complementary and/or sum to approximately 360 degrees in which case a thickness of selector layer can remain substantially uniform or constant. In other embodiments, first oblique angle 518 can be independent of second oblique angle 526, e.g., a "leg" of selector layer 504 can taper or dovetail.

In some embodiments, one or more angles 518, 526 can be selected to increase or decrease an electrical field magnitude produced near one or more of the intersections 516, 524 in response to external electrical stimulus. For example, suppose a first conductive filament is formed in selector layer 504 in response to a first stimulus (e.g., a positive voltage of a threshold magnitude). In that case, the conductive filament is created from particles of top electrode 502, conceptually similar to FIG. 2. Such particles can be ionized and driven into selector layer 504 by an electrical field that exists at or near second intersection 524 and is caused in response to the first stimulus. However, unlike cases in which selector layer 504 is entirely flat in shape, when second oblique angle 526 exists due to a bend in selector layer 504, characteristics of the electrical field can change. For example, when angle 526 is greater than 180 degrees, as depicted, the electric field will be smaller in magnitude. Thus, the first stimulus (e.g., positive voltage) has a higher threshold magnitude.

As another example, suppose a second conductive filament is formed in selector layer 504 in response to a second stimulus (e.g., a negative voltage of a threshold magnitude). In that case, the conductive filament is created from particles of bottom electrode 506, conceptually similar to FIG. 3. Such particles can be ionized and driven into selector layer 504 by an electrical field that exists at or near first intersection 516 and is caused in response to the second stimulus. Again, unlike cases in which selector layer 504 is entirely flat in shape, when first oblique angle 518 exists due to a bend in selector layer 504, characteristics of the electrical field can change similar to that described above. For example, when angle 518 is less than 180 degrees, as depicted, the electric field will be greater in magnitude. Thus, the second stimulus (e.g., negative voltage) has a lower threshold magnitude.

In some embodiments, the conductive filament formed in response to the first or second stimulus can be characterized by a width defined as comprising no more than about one to about five of the particles of top electrode 502 or bottom electrode 506. Further, top electrode 502 or bottom electrode 506 can be selected to have low electrical resistivity facilitating rapid saturation of current compliance circuitry in response to formation of the conductive filament. Such can, e.g., mitigate the need for the conductive filament to be wider than the width described above.

Figure 6A:
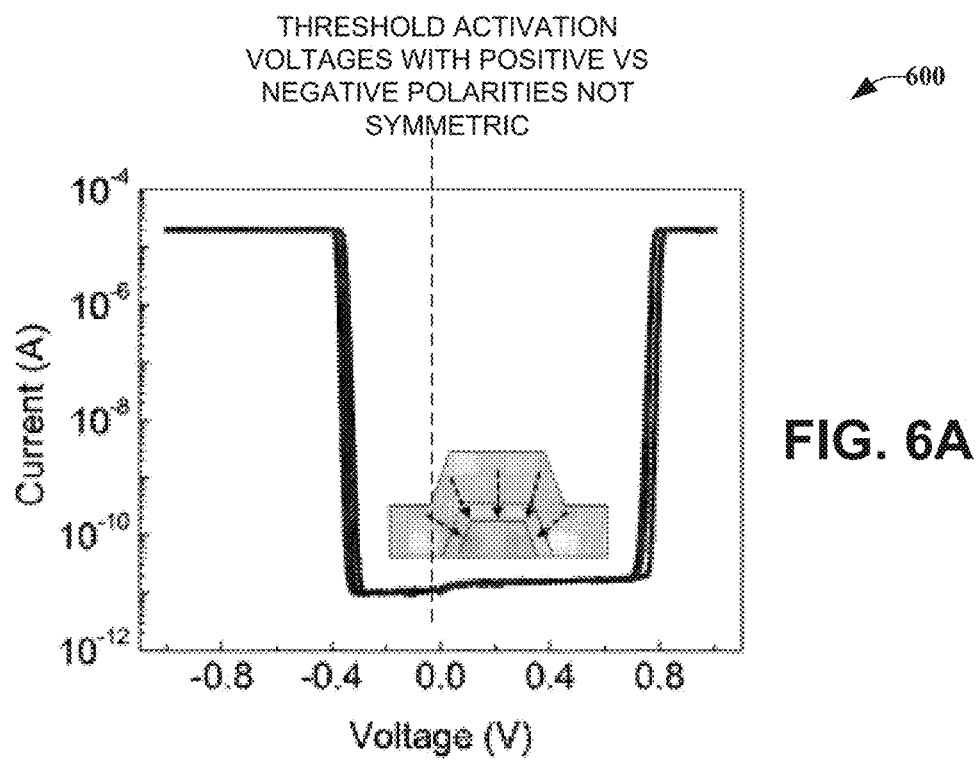
FIG. 6A depicts an example graph that illustrates I-V characteristics for a first example volatile resistive-switching device in which the first oblique angle is less than 180 degrees according to various disclosed embodiments.
Figure 6B:
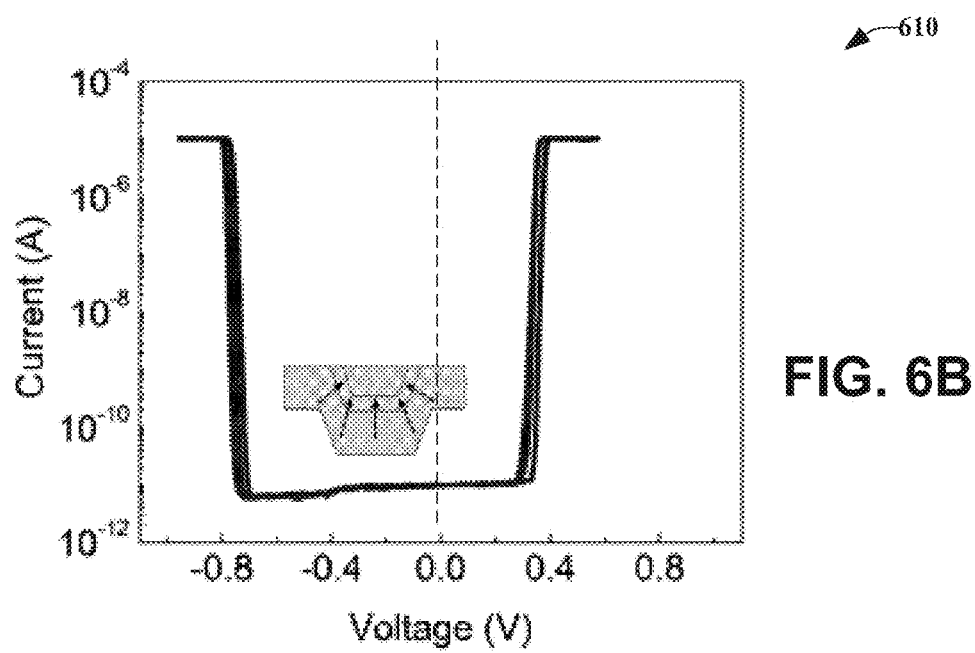
FIG. 6B depicts an example graph that illustrates I-V characteristics for a second example volatile resistive-switching device in which the first oblique angle is greater than 180 degrees according to various disclosed embodiments.

FIG. 6A depicts graph 600. Graph 600 illustrates I-V characteristics for a first example volatile resistive-switching device in which the first oblique angle is less than 180 degrees. FIG. 6B depicts graph 610. Graph 610 illustrates I-V characteristics for a second example volatile resistive-switching device in which the first oblique angle is greater than 180 degrees. As can be seen, threshold/activation voltages with positive versus negative polarities (or other suitable electrical characteristics) are no symmetrical about the zero volt line, but rather shifted or offset depending on the architecture of selector layer 504. In the case of FIG. 6A, the magnitude of a negative polarity threshold voltage is reduced and the magnitude of a positive polarity threshold voltage is increased. In the case of FIG. 6B, the shift or offset is reversed because the first oblique angle is greater than 180 degrees instead of being less than 180 degrees. Hence, the magnitude of a positive polarity threshold voltage is reduced and the magnitude of a negative polarity threshold voltage is increased. Advantageously, such phenomena can lead to reduced activation energy (e.g., due to reducing threshold voltages), which can be tuned based on a selection of first and/or second oblique angles 518, 526. As another advantage, such phenomena can lead to increased sensing margin (e.g., due to increasing threshold voltages), which can also be tuned based on a selection of first and/or second oblique angles 518, 526.

Figure 7A:
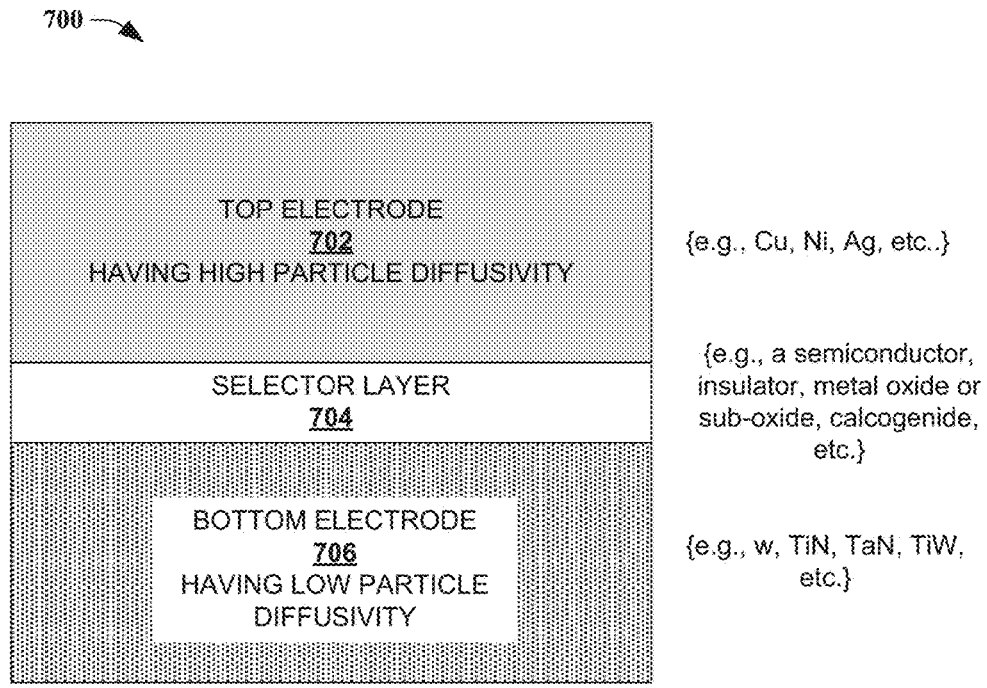
FIG. 7A depicts a block diagram of an example volatile resistive-switching device in which a first terminal has a high particle diffusivity metric and a second terminal has a low particle diffusivity metric according to various disclosed embodiments.

Turning now to FIG. 7A, volatile resistive-switching device 700 is illustrated. Volatile resistive-switching device 700 can exhibit diode-like behavior. Volatile resistive-switching device 700 can comprise top electrode 702, selector layer 704, and bottom electrode 706, all as substantially described herein but with the following constraints and/or distinctions. A first material associated with top electrode 702 can be one having a high particle diffusivity, whereas a second material associated with bottom electrode 704 can have a low particle diffusivity. It is appreciated that the above-described architecture can be reversed, that is the first material can be one with the low particle diffusivity, and the second material be one with the high particle diffusivity depending on design.

Materials with high particle diffusivity readily yield atoms to diffuse into selector layer 704, non-exhaustive examples including, copper, nickel, or silver. Examples of materials with low particle diffusivity include, non-exhaustively, tungsten, titanium nitride, tantalum nitride, or titanium-tungsten.

Figure 7B:
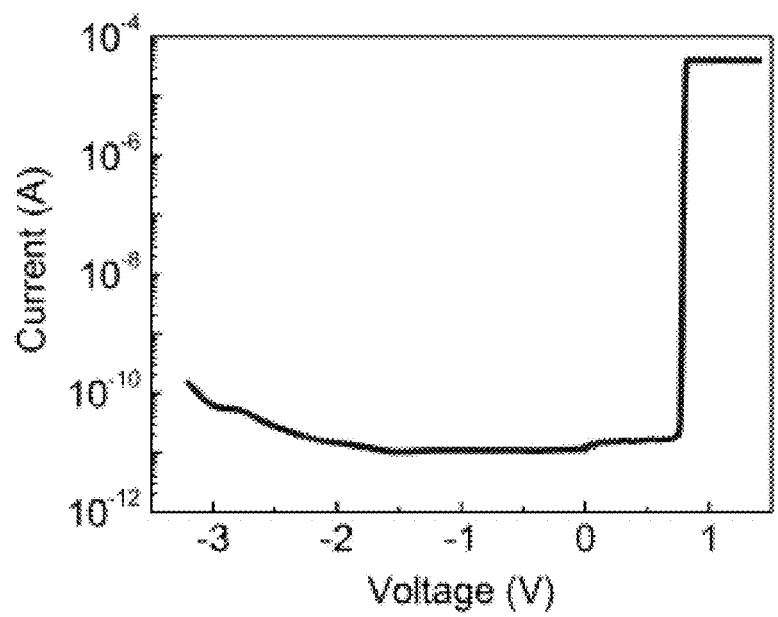
FIG. 7B depicts an example graph that illustrates I-V characteristics for the example volatile resistive-switching device with a first terminal having a high particle diffusivity metric and a second terminal having a low particle diffusivity metric exhibits diode-like behavior according to various disclosed embodiments.

FIG. 7B depicts graph 710. Graph 710 illustrates I-V characteristics for an example volatile resistive-switching device in which a first terminal has a high particle diffusivity metric and a second terminal has a low particle diffusivity metric. In this example, in response to a positive polarity voltage stimulus, the volatile resistive-switching device rapidly switches to a high-conductance state at a threshold magnitude of less than one volt. However, in response to a negative polarity voltage stimulus, the volatile resistive-switching device resists switching to the high-conductance state even at voltage magnitudes more than three times greater than the positive polarity threshold voltage.

The aforementioned diagrams have been described with respect to interaction between several components (e.g., layers) of a memory cell, a conductive layer thereof, or a memory architecture comprised of such memory cell/conductive layer. It should be appreciated that in some suitable alternative aspects of the subject disclosure, such diagrams can include those components and layers specified therein, some of the specified components/layers, or additional components/layers. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. In yet other embodiments, a disclosed memory stack or set of film layers can have fewer layers than depicted. For instance, a switching layer can electrically contact a conductive wire directly, rather than having an electrode layer there between. Additionally, it is noted that one or more disclosed processes can be combined into a single process providing aggregate functionality. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 8-11. While for purposes of simplicity of explanation, the methods of FIGS. 8-11 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 8:
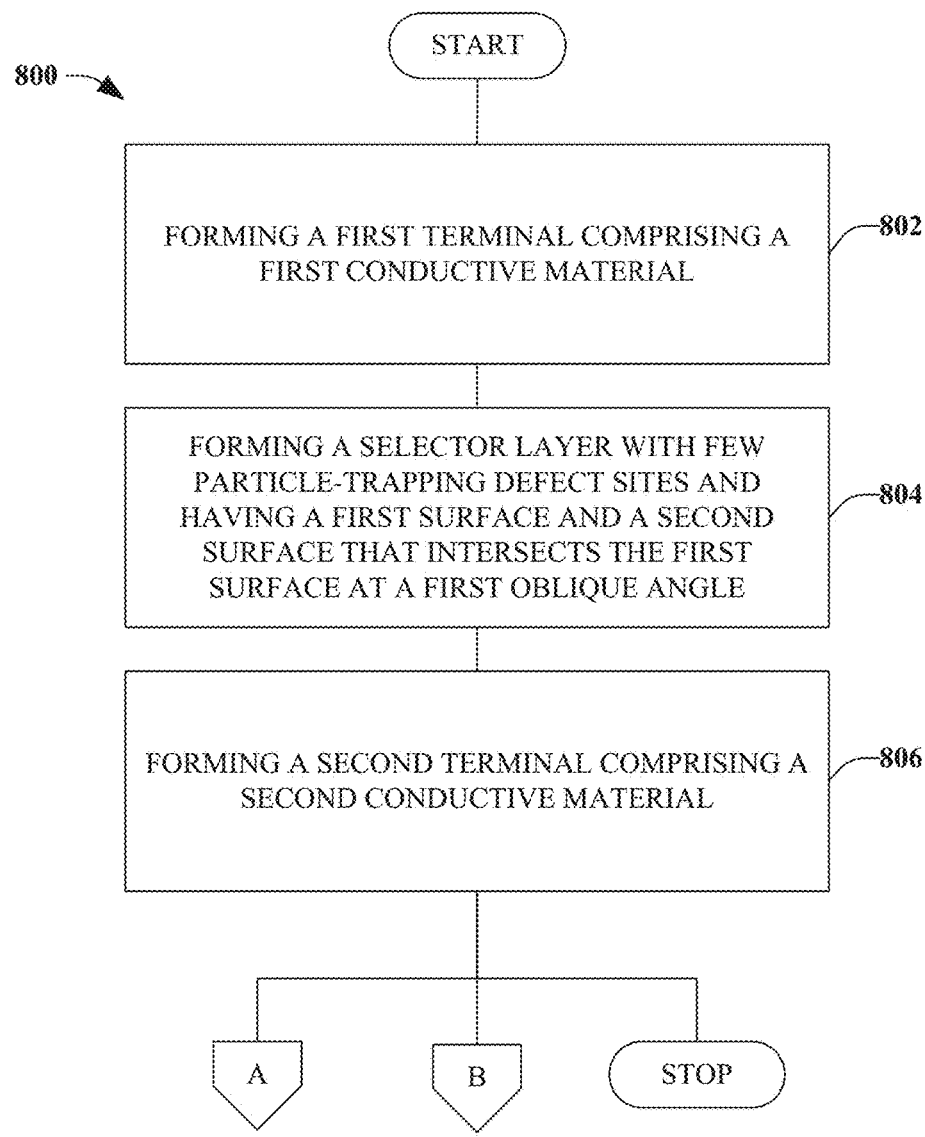
FIG. 8 illustrates a flowchart of a first example method 800 for fabricating a volatile resistive-switching device according to various disclosed embodiments.

FIG. 8 illustrates a flowchart of a first example method 800 for fabricating a volatile resistive-switching device. At 802, method 800 can comprise forming a first terminal (e.g., a bottom terminal) comprising a first conductive material. In some embodiments, the first terminal can be formed within or overlying a semiconductor substrate material. At 804, method 800 can comprise forming a selector layer that comprises a first surface and a second surface that intersects, at a first intersection, the first surface at a first oblique angle. In some embodiments, the selector layer comprises an electrical insulator material with few particle-trapping defect sites, the few particle-trapping defect sites configured to receive particles of the metal material In at least one embodiment, the selector layer can be overlying and in electrical contact with the first terminal. At 806, method 800 can comprise forming a second terminal (e.g., a top terminal) comprising a second conductive material. In at least one embodiment, the second terminal can be overlying and in contact with the selector layer. In alternative or additional embodiments, the first conductive materials can be configured to provide conductive ions to the selector layer in response to a first voltage applied across the volatile resistive-switching device. In some embodiments, the selector layer can be configured to allow the conductive ions to permeate within the selector layer in response to the voltage applied across the volatile resistive-switching device.

According to some embodiment(s), the second conductive material can be configured to provide further conductive ions to the selector layer in response to a second voltage, of different polarity (e.g., opposite polarity) as the first voltage, applied volatile resistive-switching device. In at least one embodiment, the further conductive ions can at least in part dissipate from the layer of the selector material in response to a magnitude of the first voltage or the second voltage falling below a defined voltage magnitude. In a further embodiment(s), conductivity of the layer of selector material can be decreased in response to the further conductive ions at least in part dissipating from the layer of the selector material.

In still other embodiments, the first conductive material can be selected from a group consisting of: a noble metal (e.g. Pt, Pd, Ag, Au), a metal alloy containing a noble metal in part, a fast electric field enhanced diffuser (e.g. Ni, Cu, Ag, Co, Fe) and a CMOS wiring metal (e.g. W, Al, Ti, TiN, TaN, WN). In another embodiment, material of the selector layer can be selected from a group consisting of: an insulator, a non-stoichiometric oxide, a chalcogenide, a solid-electrolyte containing one or more of Ge, Sb, S and Te, and a metal-doped material. In yet another embodiment, providing the first layer structure can further comprise providing a first electrode comprising a metal material that is selected from a group consisting of: an active metal, W, Al, Cu, TiN and TiW. In still another embodiment(s), providing the first layer structure can additionally comprise providing a first ion conductor disposed between the layer of selector material and the metal material that is selected from a second group consisting of: an ion conductor, an electrolyte, a metal oxide, and a metal oxide alloy. Method 800 can proceed to insert A detailed in connection with FIG. 9, proceed to insert B detailed in connection with FIG. 10, or end.

Figure 9:
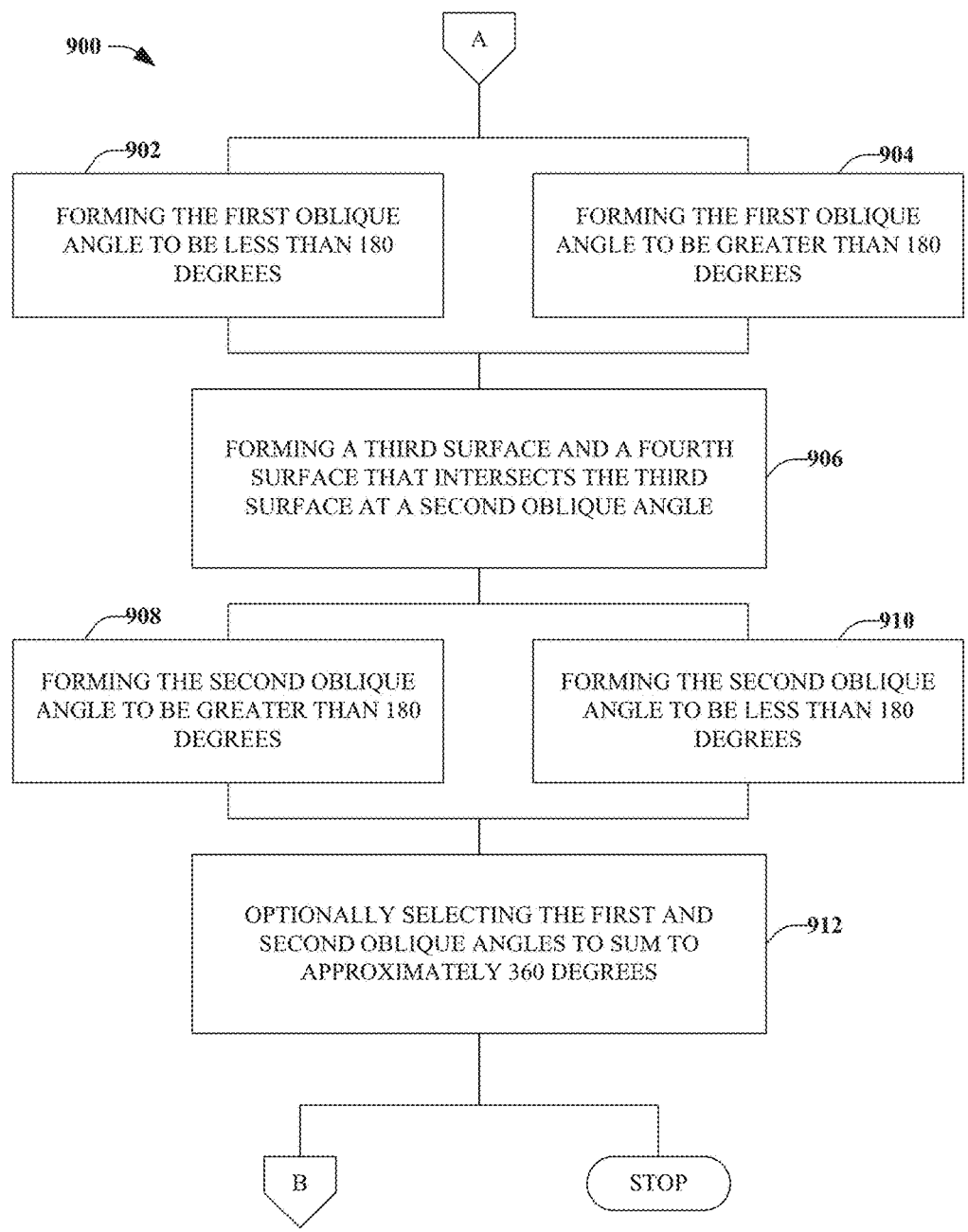
FIG. 9 illustrates a flowchart of an example method for fabricating a selector layer of the volatile resistive-switching device with certain desired characteristics according to various disclosed embodiments.

FIG. 9 illustrates a flowchart of an example method 900 for fabricating a selector layer of the volatile resistive-switching device with certain desired characteristics. For example, method 900 can be included in or performed in connection with reference numeral 804 of FIG. 8. Method 900 begins at insert A, and proceeds to either 902 or 904. At 902, method 900 can comprise forming the first oblique angle to be less than 180 degrees. At 904, method 900 can comprise forming the first oblique angle to be greater than 180 degrees. Additionally, at 906, method 900 can comprise forming a third surface and a fourth surface that intersects, at a second intersection, the third surface at a second oblique angle.

Method 900 can proceed to 908 or 910. At 908, method 900 can comprise forming a second ion conductor layer in contact with the selector material. Further, at 910, method 900 can comprise forming the second oblique angle to be greater than 180 degrees. At 910, method 900 can comprise forming the second oblique angle to be less than 180 degrees. In addition to the foregoing, at 912, method 900 can comprise selecting the first and second oblique angles to sum to approximately 360 degrees. Method 900 can terminate or proceed to insert B detailed with reference to FIG. 10.

FIG. 10 illustrates a flowchart of an example method 1000 for fabricating the volatile resistive-switching device in accordance with additional elements or aspects. At 1002, method 1000 can comprise selecting the first oblique angle to increase or decrease an electrical field magnitude produced near the first intersection in response to an external electrical stimulus. At 1004, method 1000 can comprise selecting the second oblique angle to increase or decrease an electrical field magnitude produced near the second intersection in response to an external electrical stimulus.

At 1006, method 1000 can comprise selecting the first conductive material to form a conductive filament within the selector layer in response to a negative polarity voltage. The first conductive filament can comprise particles of the first conductive material. At 1008, method 1000 can comprise selecting the second conductive material to form a conductive filament within the selector layer in response to a positive polarity voltage. The second conductive filament can comprise particles of the second conductive material.

Figure 11:
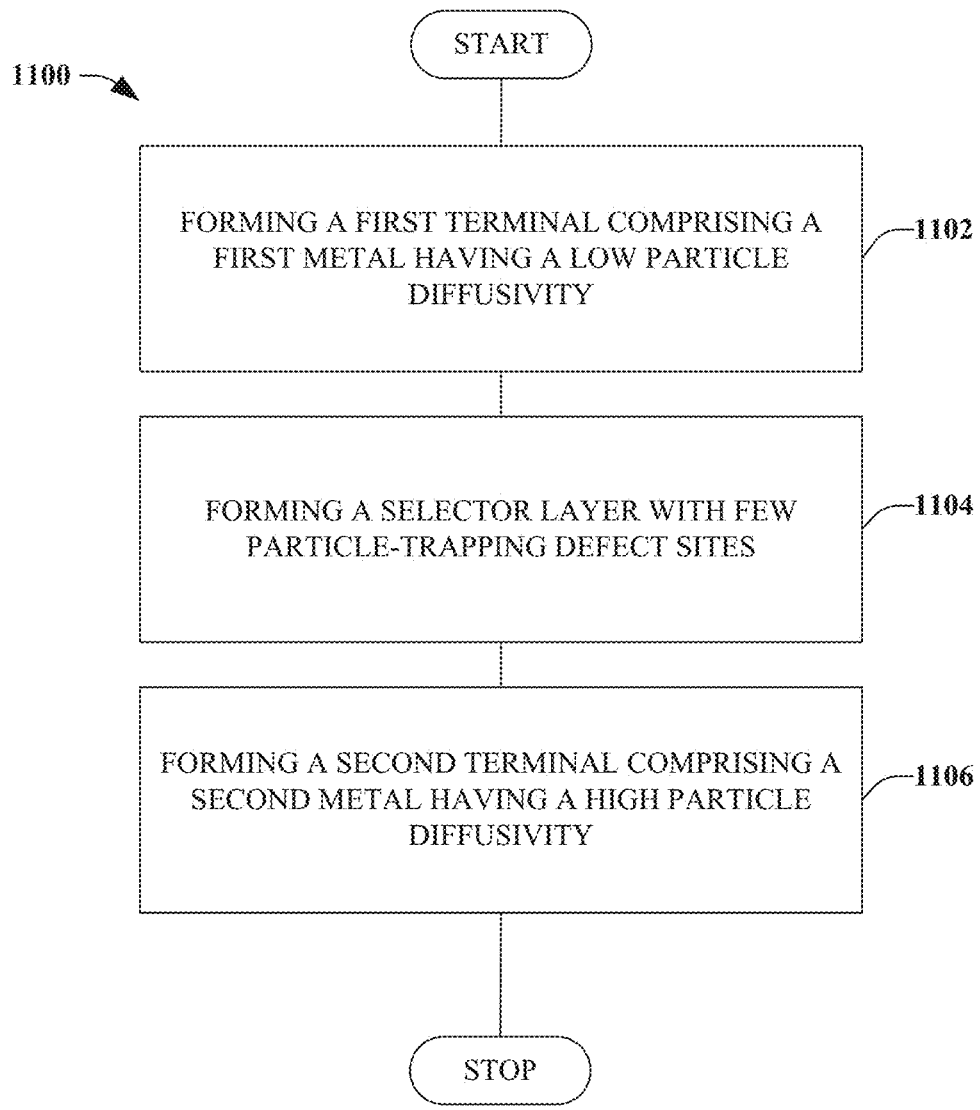
FIG. 11 illustrates a flowchart of a second example method for fabricating a volatile resistive-switching device according to various disclosed embodiments.

FIG. 11 illustrates a flowchart of a second example method 1100 for fabricating a volatile resistive-switching device. At 1102, method 1100 can comprise forming a first terminal (e.g., a bottom terminal) comprising a first metal having a low particle diffusivity. In some embodiments, the first terminal can be formed within or overlying a semiconductor substrate material. At 1104, method 1100 can comprise forming a selector layer. In some embodiments, the selector layer comprises an electrical insulator material with few particle-trapping defect sites, the few particle-trapping defect sites configured to receive particles of the metal material In at least one embodiment, the selector layer can be overlying and in electrical contact with the first terminal. At 1106, method 1100 can comprise forming a second terminal (e.g., a top terminal) comprising a second conductive material having a high particle diffusivity. In at least one embodiment, the second terminal can be overlying and in contact with the selector layer.

Figure 12:
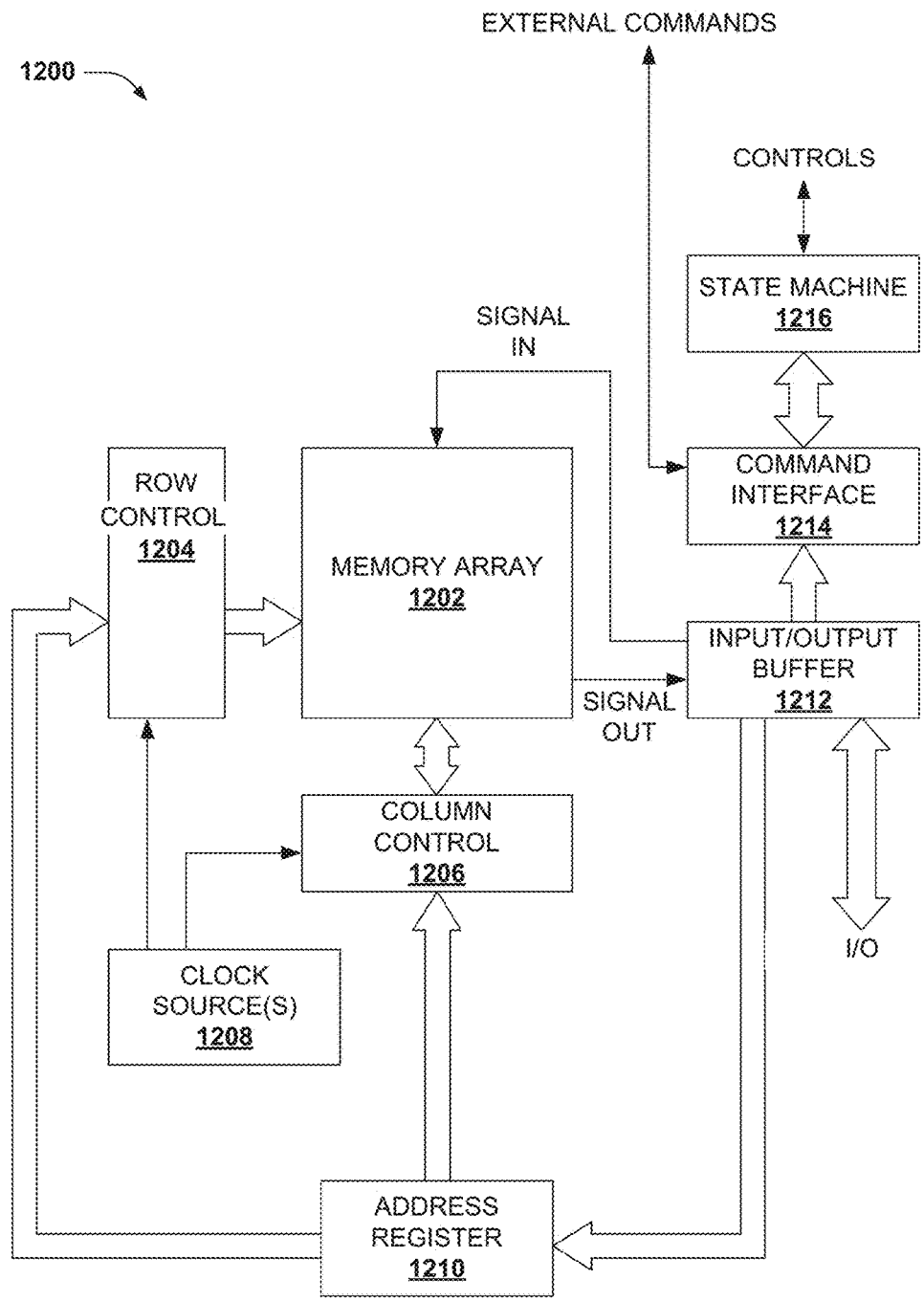
FIG. 12 depicts a block diagram of a sample operating and control environment for a memory device according to various disclosed embodiments.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of solid state memory and semiconductor architectures and process methodologies for fabricating and operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1302 of FIG. 13, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 12 illustrates a block diagram of an example operating and control environment 1200 for a memory cell array 1202 according to aspects of the subject disclosure. In at least one aspect of the subject disclosure, memory cell array 1202 can comprise a variety of memory cell technology. In at least one embodiment, memory cells of the memory cell technology can comprise two-terminal memory having a non-linear I-V response(s), as described herein. In another embodiment, memory cell array 1202 can store operations configured to cause a device to fabricate a two-terminal memory cell electrically in series with a selector device.

A column controller 1206 can be formed adjacent to memory cell array 1202. Moreover, column controller 1206 can be electrically coupled with bit lines of memory cell array 1202. Column controller 1206 can control respective bitlines, applying suitable program, erase or read voltages to selected bitlines.

In addition, operating and control environment 1200 can comprise a row controller 1204. Row controller 1204 can be formed adjacent to column controller 1206, and electrically connected with word lines of memory cell array 1202. Row controller 1204 can select particular rows of memory cells with a suitable selection voltage. Moreover, row controller 1204 can facilitate program, erase or read operations by applying suitable voltages at selected word lines.

A clock source(s) 1208 can provide respective clock pulses to facilitate timing for read, write, and program operations of row controller 1204 and column controller 1206. Clock source(s) 1208 can further facilitate selection of word lines or bit lines in response to external or internal commands received by operating and control environment 1200. An input/output buffer 1212 can be connected to an external host apparatus, such as a computer or other processing device (not depicted, but see e.g., computer 802 of FIG. 12, infra) by way of an I/O buffer or other I/O communication interface. Input/output buffer 1212 can be configured to receive write data, receive an erase instruction, output readout data, and receive address data and command data, as well as address data for respective instructions. Address data can be transferred to row controller 1204 and column controller 1206 by an address register 1210. In addition, input data is transmitted to memory cell array 1202 via signal input lines, and output data is received from memory cell array 1202 via signal output lines. Input data can be received from the host apparatus, and output data can be delivered to the host apparatus via the I/O buffer.

Commands received from the host apparatus can be provided to a command interface 1214. Command interface 1214 can be configured to receive external control signals from the host apparatus, and determine whether data input to the input/output buffer 1212 is write data, a command, or an address. Input commands can be transferred to a state machine 1216.

State machine 1216 can be configured to manage programming and reprogramming of memory cell array 1202. State machine 1216 receives commands from the host apparatus via input/output buffer 1212 and command interface 1214, and manages read, write, erase, data input, data output, and similar functionality associated with memory cell array 1202. In some aspects, state machine 1216 can send and receive acknowledgments and negative acknowledgments regarding successful receipt or execution of various commands.

To implement read, write, erase, input, output, etc., functionality, state machine 1216 can control clock source(s) 1208. Control of clock source(s) 1208 can cause output pulses configured to facilitate row controller 1204 and column controller 1206 implementing the particular functionality. Output pulses can be transferred to selected bit lines by column controller 1206, for instance, or word lines by row controller 1204, for instance.

In connection with FIG. 14, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 13:
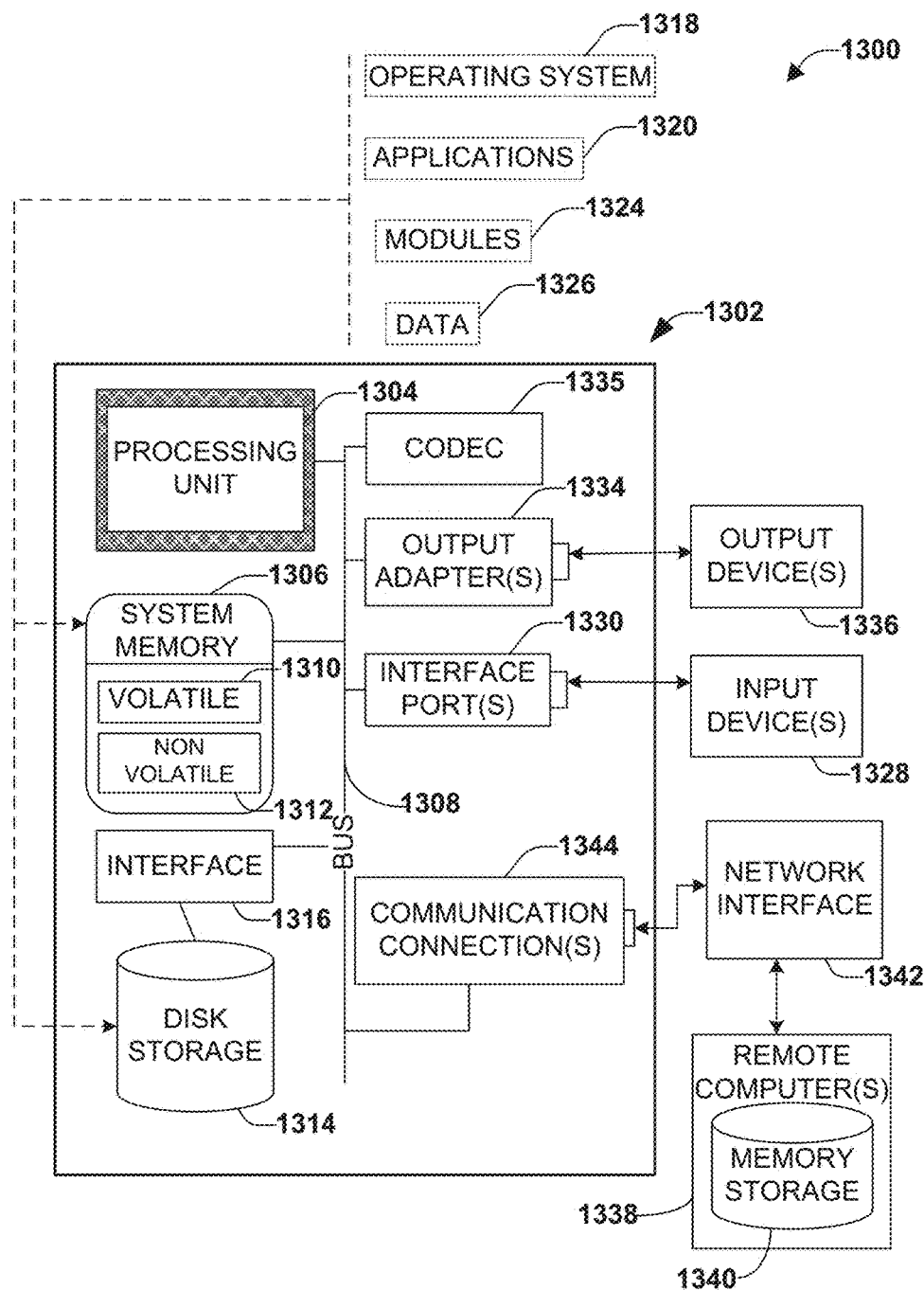
FIG. 13 illustrates a block diagram of an example computing environment that can be implemented in conjunction with various embodiments.

With reference to FIG. 13, a suitable operating environment 1300 for implementing various aspects of the claimed subject matter includes a computer 1302. The computer 1302 includes a processing unit 1304, a system memory 1306, a codec 1335, and a system bus 1308. The system bus 1308 couples system components including, but not limited to, the system memory 1306 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1306 includes volatile memory 1310 and non-volatile memory 1314, which can employ one or more of the disclosed memory architectures, in various embodiments. The basic input/output system (BIOS), containing the basic routines to transfer information between elements within the computer 1302, such as during start-up, is stored in non-volatile memory 1312. In addition, according to present innovations, codec 1335 may include at least one of an encoder or decoder, wherein the at least one of an encoder or decoder may consist of hardware, software, or a combination of hardware and software. Although, codec 1335 is depicted as a separate component, codec 1335 may be contained within non-volatile memory 1312. By way of illustration, and not limitation, non-volatile memory 1312 can include read only memory (ROM), programmable ROM (PROM), electrically programmable ROM (EPROM), electrically erasable programmable ROM (EEPROM), or Flash memory. Non-volatile memory 1312 can employ one or more of the disclosed memory architectures, in at least some disclosed embodiments. Moreover, non-volatile memory 1312 can be computer memory (e.g., physically integrated with computer 1302 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1310 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1302 may also include removable/non-removable, volatile/non-volatile computer storage medium. FIG. 13 illustrates, for example, disk storage 1314. Disk storage 1314 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1314 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1314 to the system bus 1308, a removable or non-removable interface is typically used, such as interface 1316. It is appreciated that disk storage 1314 can store information related to a user. Such information might be stored at or provided to a server or to an application running on a user device. In one embodiment, the user can be notified (e.g., by way of output device(s) 1336) of the types of information that are stored to disk storage 1314 and/or transmitted to the server or application. The user can be provided the opportunity to opt-in or opt-out of having such information collected and/or shared with the server or application (e.g., by way of input from input device(s) 1328).

It is to be appreciated that FIG. 13 describes software that acts as an intermediary between users and the basic computer resources described in the suitable operating environment 1300. Such software includes an operating system 1318. Operating system 1318, which can be stored on disk storage 1314, acts to control and allocate resources of the computer 1302. Applications 1320 take advantage of the management of resources by operating system 1318 through program modules 1324, and program data 1326, such as the boot/shutdown transaction table and the like, stored either in system memory 1306 or on disk storage 1314. It is to be appreciated that the claimed subject matter can be implemented with various operating systems or combinations of operating systems.

A user enters commands or information into the computer 1302 through input device(s) 1328. Input devices 1328 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via interface port(s) 1330. Interface port(s) 1330 include, for example, a serial port, a parallel port, a game port, and a universal serial bus (USB). Output device(s) 1336 use some of the same type of ports as input device(s) 1328. Thus, for example, a USB port may be used to provide input to computer 1302 and to output information from computer 1302 to an output device 1336. Output adapter 1334 is provided to illustrate that there are some output devices, such as monitors, speakers, and printers, among other output devices, which require special adapters. The output adapter 1334 can include, by way of illustration and not limitation, video and sound cards that provide a means of connection between the output device 1336 and the system bus 1308. It should be noted that other devices and/or systems of devices provide both input and output capabilities such as remote computer(s) 1338.

Computer 1302 can operate in a networked environment using logical connections to one or more remote computers, such as remote computer(s) 1338. The remote computer(s) 1338 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1340 is illustrated with remote computer(s) 1338. Remote computer(s) 1338 is logically connected to computer 1302 through a network interface 1342 and then connected via communication connection(s) 1344. Network interface 1342 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1344 refers to the hardware/software employed to connect the network interface 1342 to the system bus 1308. While communication connection 1344 is shown for illustrative clarity inside computer 1302, it can also be external to computer 1302. The hardware/software necessary for connection to the network interface 1342 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for fabricating a volatile resistive switching device, comprising:
   forming a first terminal comprising a first conductive material within or overlying a semiconductor substrate material;
   forming a selector layer comprising a first surface and a second surface that intersects, at a first intersection, the first surface at a first oblique angle, wherein the first surface and the second surface overlay and are in direct physical contact with the first terminal; and
   forming a second terminal, overlaying and in electrical contact with the selector layer, comprising a second conductive material;
   wherein the selector layer comprises an electrical insulator material with few particle-trapping defect sites relative to a non-volatile resistive switching device, the few particle-trapping defect sites configured to receive particles of the second conductive material, and wherein the volatile resistive switching device is a bipolar switching device that is configured to:
form a first conductive filament within the selector layer comprising particles of the first conductive material in response to a negative polarity voltage, and
form a second conductive filament within the selector layer comprising particles of the second conductive material in response to a positive polarity voltage.

2. The method of claim 1, wherein the first surface and the second surface overlay and are in electrical contact with the first terminal over substantial entireties of the first surface and the second surface.

3. The method of claim 2, wherein the forming the selector layer comprises forming the first oblique angle to be less than 180 degrees or forming the selector layer comprises forming the first oblique angle to be greater than 180 degrees.

4. The method of claim 1, wherein the first oblique angle is selected to be less than 180 degrees and to increase an electrical field magnitude produced near the first intersection in response to the negative polarity voltage, and results in a reduced threshold activation voltage for the resistive switching device in response to the negative polarity voltage.

5. The method of claim 1, wherein the first oblique angle is selected to be greater than 180 degrees and to decrease an electrical field magnitude produced near the first intersection in response to the positive polarity voltage and results in an increased threshold activation voltage for the resistive switching device in response to the positive polarity voltage.

6. The method of claim 1, wherein the selector layer further comprises a third surface and a fourth surface that intersects, at a second intersection, the third surface at a second oblique angle, wherein the first oblique angle and the second oblique angle sum to 360 degrees or approximately 360 degrees, wherein the second oblique angle results in an increased threshold activation voltage magnitude for the volatile resistive switching device in response to the negative polarity voltage, and wherein the second oblique angle results in a decreased threshold activation voltage in response to the positive polarity voltage.

7. The method of claim 1, wherein the second conductive material provides the particles of the second conductive material that includes conductive ions of the second conductive material to the selector layer to form the second conductive filament within the selector layer.

8. The method of claim 7, wherein the second conductive material is an active metal comprising a material selected from a group consisting of: tungsten, titanium, copper, aluminum, silver, platinum, palladium, tantalum, nickel, chromium, titanium nitride, tantalum nitride, a suitable metal nitride, and an alloy of the foregoing.

9. The method of claim 1, wherein the forming the selector layer comprises selecting the few particle-trapping defect sites to have a concentration that facilitates formation of the first conductive filament or the second conductive filament characterized by a width defined as comprising no more than about one to about five of the particles of the second conductive material.

10. The method of claim 9, wherein the first terminal and second terminal are selected to have low electrical resistivity facilitating rapid saturation of current compliance circuitry in response to formation of the first conductive filament or the second conductive filament, and thereby mitigating the width of the first conductive filament or the second conductive filament being greater than the about one to about five of the particles of the second conductive material.

11. The method of claim 1, wherein the forming the selector layer comprises forming a layer of a non-stoichiometric material.

12. The method of claim 1, wherein the forming the selector layer comprises forming a layer of material selected from a group consisting of: $SiO_x$, $TiO_x$, $AlO_x$, $WO_x$, $Ti_xN_yO_z$, $HfO_x$, $TaO_x$, $CuO_x$, $NbO_x$, or the like, or a suitable combination thereof, where x, y and z are suitable non-stoichiometric values.

13. A volatile resistive switching device, comprising:
a first electrode comprising a first metal;
a selector layer having a non-planar surface that overlies and is in direct physical contact with a corresponding non-planar surface of the first electrode, wherein an angle of the non-planar surface is configured to increase or decrease an electric field magnitude affecting the selector layer in response to an external stimulus; and
a second electrode, in contact with the selector layer, comprising a second metal;
wherein the volatile resistive switching device, comprising the first electrode, the selector layer, and the second electrode, is characterized by a first electrical resistance in response to the external stimulus being above a threshold magnitude, greater than zero volts, and is characterized by a second electrical resistance in response to the external stimulus decreasing from above the threshold magnitude to below the threshold magnitude and greater than zero volts, and wherein the selector layer comprises an electrical insulator material with few particle-trapping defect sites relative to a non-volatile resistive switching device, the few particle-trapping defect sites configured to receive particles of the second metal, and further wherein the volatile resistive switching device is a bipolar switching device that is configured to:
form a first conductive filament within the selector layer comprising particles of the first metal in response to a first polarity voltage applied to the volatile resistive switching device, and
form a second conductive filament within the selector layer comprising particles of the second metal in response to a second polarity voltage applied to the volatile resistive switching device, wherein the second polarity voltage is a different polarity from the first polarity voltage.

14. The volatile resistive switching device of claim 13, wherein the angle is an oblique angle.

15. The volatile resistive switching device of claim 13, wherein the selector layer comprises a thickness affecting a value of the threshold magnitude, wherein the thickness is selected to achieve a target value of the threshold magnitude.

16. The volatile resistive switching device of claim 15, wherein the selector layer further comprises a second non-planar surface in contact with another corresponding non-planar surface of the second electrode, the second non-planar surface comprising a second angle configured to increase or decrease a second electric field magnitude affecting the selector layer in response to a second external stimulus of opposite polarity from the external stimulus.

17. The volatile resistive switching device of claim 13, wherein the particles of the first metal become ions of the first metal in response to the first polarity voltage, and wherein the particles of the second metal become ions of the second metal in response to the second polarity voltage.

18. The volatile resistive switching device of claim 13, wherein the selector layer comprises a layer of a non-stoichiometric material.

19. The volatile resistive switching device of claim 13, wherein the selector layer comprises a layer of material selected from a group consisting of: $SiO_x$, $TiO_x$, $AlO_x$, $WO_x$, $Ti_xN_yO_z$, $HfO_x$, $TaO_x$, $CuO_x$, $NbO_x$, or the like, or a suitable combination thereof, where x, y and z are suitable non-stoichiometric values.

20. The volatile resistive switching device of claim 13, wherein the particles of the first metal are selected from a group consisting of: tungsten, titanium, copper, aluminum, silver, platinum, palladium, tantalum, nickel, chromium and titanium.

\* \* \* \* \*